US010181538B2

(12) United States Patent
Ning et al.

(10) Patent No.: US 10,181,538 B2
(45) Date of Patent: Jan. 15, 2019

(54) QUANTUM-DOT-IN-PEROVSKITE SOLIDS

(71) Applicant: THE GOVERNING COUNCIL OF THE UNIVERSITY OF TORONTO, Toronto (CA)

(72) Inventors: Zhijun Ning, Shanghai (CN); Xiwen Gong, Toronto (CA); Riccardo Comin, Udine (IT); Oleksandr Voznyy, Thornhill (CA); Edward Sargent, Toronto (CA)

(*) Notice: Subject to any disclaimer, the term of this patent is extended or adjusted under 35 U.S.C. 154(b) by 81 days.

(21) Appl. No.: 15/063,102

(22) Filed: Mar. 7, 2016

(65) Prior Publication Data

US 2016/0380136 A1     Dec. 29, 2016

Related U.S. Application Data

(60) Provisional application No. 62/099,661, filed on Jan. 5, 2015.

(51) Int. Cl.
*H01L 31/036* (2006.01)
*H01L 31/0352* (2006.01)
(Continued)

(52) U.S. Cl.
CPC ...... *H01L 31/035218* (2013.01); *C01G 21/06* (2013.01); *C04B 35/5152* (2013.01); *C04B 35/553* (2013.01); *C09K 11/02* (2013.01); *C09K 11/661* (2013.01); *H01L 31/028* (2013.01); *H01L 31/0296* (2013.01); *H01L 31/036* (2013.01); *H01L 31/0324* (2013.01); *H01L 31/0368* (2013.01); *B82Y 30/00* (2013.01); *B82Y 40/00* (2013.01); *C04B 2235/446* (2013.01); *C04B 2235/768* (2013.01);
(Continued)

(58) Field of Classification Search
None
See application file for complete search history.

(56) References Cited

U.S. PATENT DOCUMENTS 6,093,338 A * 7/2000 Tani ...................... C04B 35/462
                                                          252/62.9 PZ
7,704,321 B2    4/2010 Riman et al.
(Continued)

FOREIGN PATENT DOCUMENTS

| WO | 2014181072 | 11/2014 |
| WO | 2015160816 | 10/2015 |
| WO | 2016083783 | 6/2016 |

OTHER PUBLICATIONS

D. N. Dirin, et al., J. Am. Chem. Soc., 136, 6550 (2014).
(Continued)

*Primary Examiner* — Katie L Hammer
(74) *Attorney, Agent, or Firm* — Hill & Schumacher

(57) ABSTRACT

The present disclosure provides a composite material of a pre-formed crystalline or polycrystalline semiconductor particles embedded in a crystalline or polycrystalline perovskite matrix material. The pre-formed crystalline or polycrystalline semiconductor particles and and crystalline or polycrystalline perovskite being selected so that any lattice mismatch between the two lattices does not exceed about 10%. The pre-formed crystalline or polycrystalline semiconductor particles and said crystalline or polycrystalline perovskite matrix material have lattice planes that are substantially aligned.

34 Claims, 19 Drawing Sheets

(51) Int. Cl.
*H01L 31/028* (2006.01)
*H01L 31/0296* (2006.01)
*H01L 31/032* (2006.01)
*H01L 31/0368* (2006.01)
*C09K 11/02* (2006.01)
*C04B 35/515* (2006.01)
*C04B 35/553* (2006.01)
*C01G 21/06* (2006.01)
*C09K 11/66* (2006.01)
*H01L 51/42* (2006.01)
*B82Y 30/00* (2011.01)
*B82Y 40/00* (2011.01)

(52) U.S. Cl.
CPC ........ *C04B 2235/80* (2013.01); *H01L 51/426* (2013.01); *Y10S 977/774* (2013.01); *Y10S 977/892* (2013.01); *Y10S 977/932* (2013.01)

(56) References Cited

U.S. PATENT DOCUMENTS

| | | |
|---|---|---|
| 8,034,745 B2 | 10/2011 | Goyal |
| 2003/0211741 A1* | 11/2003 | Suzuki .................. C23C 16/409 438/689 |
| 2004/0253443 A1* | 12/2004 | Anselmann ........... C08F 257/00 428/403 |
| 2007/0138459 A1* | 6/2007 | Wong ..................... B82Y 25/00 257/9 |
| 2008/0001538 A1 | 1/2008 | Cok |
| 2008/0176749 A1* | 7/2008 | Goyal .................. H01L 39/126 505/125 |
| 2008/0265255 A1* | 10/2008 | Goyal .................... B82Y 10/00 257/64 |
| 2010/0224823 A1* | 9/2010 | Yin ........................ B82Y 30/00 252/62.56 |
| 2013/0058870 A1* | 3/2013 | Lacroix .................. B82Y 30/00 424/9.3 |
| 2013/0320836 A1* | 12/2013 | Kanatzidis ............ H01L 31/032 313/483 |
| 2014/0326949 A1 | 11/2014 | Xu et al. |

OTHER PUBLICATIONS

W. P. McCray, Nat. Nanotech. 2, 259 (2007).
D. B. Mitzi et al., IBM J. Res. & Dev. vol. 45 No. 1 Jan. 2001.
Z. Ning, H. Dong, Q. Zhang, O. Voznyy, and E. H. Sargent, ACS Nano, 8, 10321, (2014).
International Search Report (PCT/CA2016/050244)—dated Aug. 29, 2016.

* cited by examiner

Matched QD

Unmatched QD

HOMO

LUMO

QUANTUM-DOT-IN-PEROVSKITE SOLIDS

FIELD

The present disclosure relates to crystalline particles embedded in a crystalline matrix with the lattice planes of the crystalline particles being aligned with the lattice planes of the crystalline matrix. These composite materials have applications in light-emitting materials and devices, with further applications in light sensors, lasers, photovoltaics, thermophotovoltaics, and thermal transport materials.

BACKGROUND

Atomically-aligned growth of a crystalline film atop a substrate—heteroepitaxy—has largely relied on vacuum methods such as molecular-beam epitaxy (MBE), atomic-layer epitaxy (ALE), and metalorganic vapour phase epitaxy (MOCVD) (1,2). Through these methods, theoretical predictions have been tested and refined that describe conditions under which crystalline coherence can be preserved even in the presence of a mismatch in the native lattices (strained-layer epitaxy). The result is a vast body of theory, knowledge, and practice regarding vapour-phase epitaxy. Since interfacial defects can be rendered rare at suitably-designed heterointerfaces, highly efficient luminescent materials have been created that have enabled efficient electrically-injected lasers and light-emitting diodes both for fiber-optic communications and high-efficiency lighting (3-5).

The past two decades have seen the rapid rise of soft condensed matter, often in the form of solution-processed semiconductors based on organic molecules, polymers, and colloidal nanoparticles (plates, wires, and dots) (6-10). In this vein, and with astonishing rapidity, bulk organohalide semiconductor perovskites exhibiting large and perfect crystalline domains have improved in size, properties, and performance. These remarkable materials have enabled the ascent of the perovskite solar cell (11-13).

SUMMARY

The present disclosure provides a composite material, comprising:
pre-formed crystalline or polycrystalline particles embedded in a crystalline or polycrystalline matrix material, said pre-formed crystalline or polycrystalline particles and said crystalline or polycrystalline matrix material being selected so that any lattice mismatch between the two lattices does not exceed about 10%, said pre-formed crystalline or polycrystalline particles and said crystalline or polycrystalline matrix material having lattice planes that are substantially aligned.

In an aspect the composite material comprises:
pre-formed crystalline or polycrystalline semiconductor particles embedded in a crystalline or polycrystalline perovskite matrix material, said pre-formed crystalline or polycrystalline semiconductor particles and said crystalline or polycrystalline perovskite
being selected so that any lattice mismatch between the two lattices does not exceed about 10%; and
said pre-formed crystalline or polycrystalline semiconductor particles and said crystalline or polycrystalline perovskite matrix material having lattice planes that are substantially aligned.

In an embodiment of the composite material the perovskite matrix material is a perovskite material of form $A_2MX_4$, $AMX_3$, $ANX_4$, or $BMX_4$, wherein
A is a monovalent cation or combination of monovalent cations selected from Li, Na, K, Rb, Cs, Fr, and primary, secondary, tertiary or quaternary organic ammonium compounds containing 1 to 15 carbons,
B is a divalent cation or combination of divalent cations selected from Mg, Co, Ca, Cd, Sr, Ba and primary, secondary, tertiary or quaternary organic ammonium compounds having 1 to 15 carbons,
M is a divalent metal cation or combination of divalent metal cations selected from Pb, Sn, Cu, Ni, Co, Fe, Cr, Pd, Cd, Eu, Yb, Ge,
N is selected from Bi and Sb, and
X is a monovalent anion or combination of monovalent anions selected from I, Br, Cl, SCN, CN, OCN or $BF_4$.

In other embodiments the perovskite matrix may be any one of $(A)PbI_3$, $(A)PbBr_3$, $(A)PbCl_3$, $(A)PbI_xBr_{(3-x)}$, $(A)PbI_xCl_{(3-x)}$, $(X)PbBr_xCl_{(3-x)}$, $NaPbI_3CsPbI_3$, $CsPbBr_3$, $CsPbCl_3$, $CsPbI_xBr_{(3-x)}$, $CsPbI_xCl_{(3-x)}$, $CsPbBr_xCl_{(3-x)}$, $(C_4H_9NH_3)_2PbI_4$, $(C_4H_9NH_3)_2PbBr_4$, $(C_4H_9NH_3)_2PbCl_4$, $(C_4H_9NH_3)_2PbI_xBr_{(4-x)}$, $(C_4H_9NH_3)_2PbI_xCl_{(4-x)}$, $(C_4H_9NH_3)_2PbBr_xCl_{(4-x)}$, $KPbI_3$, where A is any one of methylammonium ($CH_3NH_3$), ammonium ($NH_4$), formamidium ($CH_2(NH_2)_2$), and ethylammonium ($CH_3CH_2NH_3$).

The semiconductor particles may be any one of PbS, PbSe, PbTe, PbSSe, $CsPbI_3$, $CsPbBr_3$, CdS, CdSe, CdTe, SnS, SnSe, SnTe, HgTe, FeO, NiO, $TiO_2$, ZnO, ZnS, ZnSe, ZnTe, $Bi_2S_3$, $Bi_2Se_3$, $Bi_2Te_3$, Si, Ge, GaAs, GaN, GaP, GaSb, GaPAs, CuO, $Cu_2O$, $CuInS_2$, $CuInSe_2$, CuInSSe, $CuZnSnS_4$, InAs, InSb, InP, CuInP, CdSeTe, and Mn-doped ZnTe.

In some embodiments the semiconductor particles may be metal chalcogenides.

The semiconductor particles may be present in the perovskite matrix material in a volume ratio of about 0.001% to about 80%, in other embodiments the ratio may be from about 0.1% to about 50%.

The pre-formed semiconductor particles may have a size in a range from about 1 nm to 100 μm, or in some embodiments the pre-formed semiconductor particles may have a size in a range from about 2 nm to 12 nm, or from about 1 nm to about 30 nm.

The pre-formed semiconductor particles may be monodisperse.

The pre-formed crystalline or polycrystalline semiconductor particles and the crystalline or polycrystalline perovskite matrix material may be selected so that any lattice mismatch between the two lattices does not exceed about 5%.

The present disclosure provides a method for synthesizing a composite material, comprising:
mixing pre-formed crystalline or polycrystalline semiconductor particles with a liquid containing one or more precursors of a crystalline or polycrystalline perovskite matrix material to form a mixture, said pre-formed crystalline or polycrystalline particles and said crystalline or polycrystalline matrix material being selected so that any lattice mismatch between the two lattices does not exceed about 10%;
subjecting the mixture to conditions suitable to induce formation of the crystalline or polycrystalline perovskite lattice matrix material in which the pre-formed crystalline or polycrystalline semiconductor particles are enveloped to form the composite material; and
wherein the composite material is characterized in that the pre-formed crystalline or polycrystalline semiconductor particles and the crystalline or polycrystalline perovskite matrix material have lattice planes that are substantially aligned.

A further understanding of the functional and advantageous aspects of the disclosure can be realized by reference to the following detailed description and drawings.

BRIEF DESCRIPTION OF THE DRAWINGS

FIGS. 1A-1D show the results of theoretical modelling of perovskite epitaxial growth on colloidal quantum dots (CQDs), in which:

FIG. 1A shows an atomistic model of CQDs in perovskite matrix in three dimensional (3D) view, FIG. 1B shows cross-section (2D view) scheme of single CQD in perovskite in which all facets of CQDs can match well with perovskite, FIG. 1C shows modelling of PbS and $MAPbI_3$ crystal structures and their interface, showing that perovskite can match well with PbS from the Z axis [001], and FIG. 1D shows modelling of PbS and $MAPbI_3$ crystal structures and their interface, showing that perovskite can match well with PbS from the X-Y axis [010].

FIG. 3 shows the photophysical response of CQD:perovskite hybrids, in which:

FIG. 4 shows the carrier transfer mechanism from the perovskite matrix to the CQDs inside the hybrid materials, in which:

FIG. 4B1 shows the photoluminescence excitation spectra of CQDs;

FIG. 4B2 shows the PLQE of the CQDs inside the hybrid materials when the perovskites (635 nm) are excited or when the quantum dots are excited (815 nm);

FIG. 7 shows the compositional analysis of PHC. All the elements (as labelled) are observed in the film, indicating the existence of both PbS and $MAPbI_3$ in which:

DETAILED DESCRIPTION

Figure 1A:
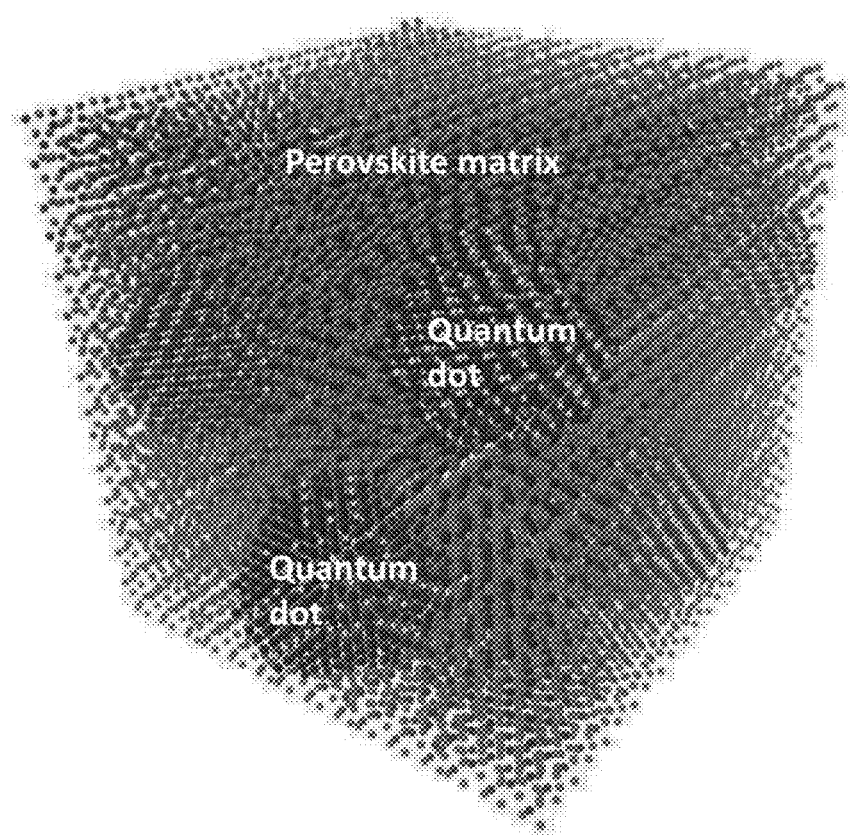

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions.

As used herein, the phrase "pre-formed crystalline or polycrystalline particles" refers to crystalline or polycrystalline particles, which may be from micron-sized to nano-sized particles (e.g, quantum dots), that have been produced prior to being incorporated into a crystalline or polycrystalline matrix material. The particles are pre-formed to have selected size(s), shapes, geometries, aspect ratios, composition etc., which will reflect the application for which the composites are being produced. In other words, in contrast to other techniques for producing particle/composites, the particles in the present disclosure are pre-formed with the desired end characteristics, while in many other techniques, the fabrication process for producing the composite actually determines the characteristics of the particles in the final composite. The properties of preformed nano and microparticles can include: a high degree of monodispersity, which is to say substantial consistency in the dimensions and shape of the nano or microparticles. In example embodiments, substantially monodispersed nanoparticles can include nanoparticles having an average diameter of approximately 3.5 nm, and a standard deviation in their diameter of less than 1.0 nm, and a typically consistent shape among nanoparticles within the ensemble: for example, the preponderance of the particles may adopt a shape such as one approximating a sphere, or a cube, or an octahedron.

The semiconductor nanoparticles may be quantum confined or not quantum confined. The particles may be isotropic or anisotropic shapes, including spheroids, rods, plates, tetropods, cubes, prisms, pyramids, and other polyhedra, and they may be monodisperse.

As used herein, the phrase "lattice planes that are substantially aligned" means that a given crystal plane of a given pre-formed semiconductor particle aligns to a given crystal plane in the crystalline or polycrystalline matrix material. It will be appreciated that when the lattice constants are slightly different, the given crystal plane of the preformed semiconductor particle will be slightly offset from the given crystal plane of the crystalline or polycrystalline matrix material but they are still considered "substantially aligned".

The inventors contemplate that in cases, when the lattice mismatch is typically less than 5%, the lattice planes may become substantially aligned as defined above, and the probability of defect formation in the crystal lattice and/or at the heterointerfaces can be desirably low. However, without being bound by any theory, it will be appreciated by those skilled in the art, that some pairs of materials that have a lattice mismatch of up to about 10% may still be capable of lattice plane alignment because they may be able to accommodate higher strain without significant defect formation compared to other materials.

As used herein, the phrase "subjecting the mixture to conditions suitable to induce formation of the crystalline or polycrystalline perovskite matrix material in which said pre-formed crystalline or polycrystalline semiconductor particles are enveloped" means pre-formed crystalline or polycrystalline semiconductor particles are formed inside crystalline or polycrystalline perovskite matrix material made: 1) through one step method from a solution containing all precursors; 2) through multiple steps, with a matrix formed from one or more precursors reacted with remaining precursors in solution; 3) through multiple steps, with a matrix formed from one or more precursors reacted with remaining precursors in vapor phase.

The present inventors have synthesized a new composite material via entirely solution-based methods. By combining organohalide perovskites and pre-formed colloidal quantum dots in the liquid phase, thin films of epitaxially-aligned heterocrystals that we term poly hetero crystalline (PHC) solids have been produced. However it will be understood that the materials produced herein are essentially composite materials.

PHC solids consist of quantum-size-effect-tuned nanoparticles ("quantum dots") embedded within a matrix material, where the crystalline axes of the nanoparticle and matrix materials are atomically aligned.

The present inventors have ascertained the PHC structure using transmission electron microscopy (TEM) and diffraction and have found heterocrystals as large as ~60 nm and containing at least 20 mutually-aligned dots that inherit the crystalline orientation of the perovskite matrix.

PHC solids exhibit remarkable optoelectronic properties that are traceable to their atom-scale crystalline coherence.

Quantum dot nanocrystals are well-known as excellent light emitters; the underlying challenge has been that because they are nano-confined, they are also prone to surface states and traps that hinder efficient carrier injection. Studies show that the photocarriers generated in the larger-bandgap perovskites are injected into the quantum dot nanocrystals with greater than 80% efficiency.

The PHC structure thus capitalizes on the perovskites' excellent carrier diffusion properties to (a) provide an efficient medium to transport carriers over long distances to the nanocrystals, (b) provide a pure and defect-free epitaxial interface between the nanocrystals and the matrix and (c) supply the nanocrystals with carriers while concomitantly shielding them from carrier losses. These combined effects lead to exceptionally efficient light emission by the nanocrystals, as verified by photoluminescence quantum efficiency (PLQE) measurements which showed that nanocrystals in a perovskite matrix had approximately 3000 times better PLQE than a nanocrystal film alone. Additionally, photoluminescence excitation spectroscopy has shown that the luminescence intensity increases as the perovskite volume increases, demonstrating the transfer of carriers from the perovskite to the nanocrystal, where the carriers radiatively recombine.

PHC solids are fabricated not via typical vacuum-deposition methods, but rather wholly in solution. The present work marks the first time that quantum dots have been epitaxially embedded into a matrix. The epitaxial bonding between the matrix and the quantum dots produces the extremely clean and defect-free interface that gives rise to the material's useful properties.

Characteristics of the PHC Invention

In the broadest aspect, the present disclosure provides a composite material comprising pre-formed crystalline (i.e. single crystal) or polycrystalline particles embedded in a crystalline (i.e. single crystal) or polycrystalline matrix material in which the pre-formed crystalline or polycrystalline particles and the crystalline or polycrystalline matrix material have lattice constants which are within about 10% (more likely 5%) of one another, and the pre-formed crystalline or polycrystalline particles and the crystalline or polycrystalline matrix material having lattice planes that are substantially aligned in the final composite material. The observation of the alignment of the lattice planes was very surprising, and has significant implications for development of various optical devices.

In one embodiment, pre-formed, quantum tuned PbS nanoparticles are embedded in a matrix of methylammonium lead iodide perovskite ($CH_3NH_3PbI_3$), with a volume percentage of nanoparticles ranging from 0.4% to 28%. In one embodiment, pre-formed, quantum tuned PbS nanoparticles with bandgaps <1 eV are embedded in a matrix of methylammonium lead halide perovskite ($CH_3NH_3PbI_xBr_{(3-x)}$), with a volume percentage of nanoparticles ranging from 2% to 17%, for the purposes of integration into an electrically driven light-emitting device. In one embodiment, pre-formed, quantum tuned PbSe nanoparticles are embedded in a matrix of butylammonium lead iodide perovskite ($C_4H_9NH_3PbI_3$). In one embodiment, pre-formed, quantum tuned PbS nanoparticles are embedded in a matrix of methylammonium lead iodide perovskite ($CH_3NH_3PbI_3$), with a volume percentage of nanoparticle reaching over about 70%, for the purposes of integration into a photovoltaic device.

In non-limiting exemplary embodiments, a photocarrier generated in the matrix material is transferred with efficiency exceeding 80% to the nanoparticle. In non-limiting exemplary embodiments, the matrix material is chosen from the list can include, but is not limited to, any one of the following species:
(A)$PbI_3$, (A)$PbBr_3$, (A)$PbCl_3$, (A)$PbI_xBr_{(3-x)}$, (A)$PbI_xCl_{(3-x)}$, (X)$PbBr_xCl_{(3-x)}$, $NaPbI_3$, $CsPbI_3$, $CsPbBr_3$, $CsPbCl_3$, $CsPbI_xBr_{(3-x)}$, $CsPbI_xCl_{(3-x)}$, $CsPbBr_xCl_{(3-x)}$, $(C_4H_9NH_3)_2PbI_4$, $(C_4H_9NH_3)_2PbBr_4$, $(C_4H_9NH_3)_2PbCl_4$, $(C_4H_9NH_3)_2PbI_xBr_{(4-x)}$, $(C_4H_9NH_3)_2PbI_xCl_{(4-x)}$, $(C_4H_9NH_3)_2PbBr_xCl_{(4-x)}$, $KPbI_3$, where A is any one of methylammonium ($CH_3NH_3$), ammonium ($NH_4$), formamidium ($CH_2(NH_2)_2$), and ethylammonium ($CH_3CH_2NH_3$). Other suitable inorganic matrix materials include ZnS, ZnSe, CdS, ZnTe, CdSe, $PbI_2$, $CdI_2$, NaI, NaBr, NaCl, KI, KBr, KCl, CsI, CsBr, CsCl, and $Cs_4PbBr_6$ In non-limiting exemplary embodiments, the particle may be any one of the following species:
PbS, PbSe, PbTe, PbSSe, $CsPbI_3$, $CsPbBr_3$, CdS, CdSe, CdTe, SnS, SnSe, SnTe, HgTe, FeO, NiO, $TiO_2$, ZnO, ZnS, ZnSe, ZnTe, $Bi_2S_3$, $Bi_2Se_3$, $Bi_2Te_3$, Si, Ge, GaAs, GaN, GaP, GaSb, GaPAs, CuO, $Cu_2O$, $CuInS_2$, $CuInSe_2$, CuInSSe, $CuZnSnS_4$, InAs, InSb, InP, CuInP, CdSeTe, and Mn-doped ZnTe.

In embodiments, the matrix material is processed using solution-phase precursors. In non-limiting exemplary embodiments, the nanoparticle is synthesized and dispersed as a colloidal particle.

Characteristics of the PHC Fabrication Process

In one embodiment, a method for building PHC solids is provided. Pre-fabricated quantum dots with atomic ligands are mixed with a solution of perovskite precursors, and then spin coated onto a rigid substrate. The resulting thin film is then dip-coated into a methylammonium iodide (or similar organic salt) solution. This simple process achieves full conversion into the PHC.

This work reports an in-situ epitaxial growth process of perovskite on quantum dot surfaces. The quantum dots are well-passivated by the matrix, without the need for conventional organic ligands, when lattice-matching conditions are fulfilled. The perovskite matrix provides excellent carrier transport to the CQDs thanks to its excellent diffusion length. The new approach paves the way for novel strategies to enhance the performance of CQD-based optoelectronic devices, and to extend towards the infrared the spectral diversity of perovskite-based materials.

We posited that—under the right conditions—heteroepitaxial alignment could be produced between bulk perovskite semiconductors and quantum-tuned nanoparticles. Thin films comprising multi-material, yet internally-epitaxial-aligned, heterocrystals—complex crystals we herein term poly hetero crystalline (PHC) solids—could combine, without undue photocarrier loss, the desired properties of each phase: the excellent charge carrier transport of the bulk perovskites, and the quantum-tuned infrared luminescence of the quantum dot phase.

We sought to implement these ideas in a materials system that would show promise for epitaxial alignment, and would illustrate potential applied interest. From an applied perspective, methylammonium lead iodide perovskite ($MAPbI_3$) has led to the most efficient solution-processed solar cells ever reported. Colloidal quantum dots based on PbS have been widely shown to exhibit highly tunable photophysical properties, including in the near- and short-wavelength infrared which, today, the perovskites fail to access. From a materials science perspective, $MAPbI_3$ (tetragonal) and PbS (rocksalt) possess related crystal structures, each having a six-coordinated Pb atom, and with Pb—Pb distance (PbS 5.97 Å, MAPbI$_3$ 6.26 Å) that reside within 4.6% of one another (11).

Figure 1B:
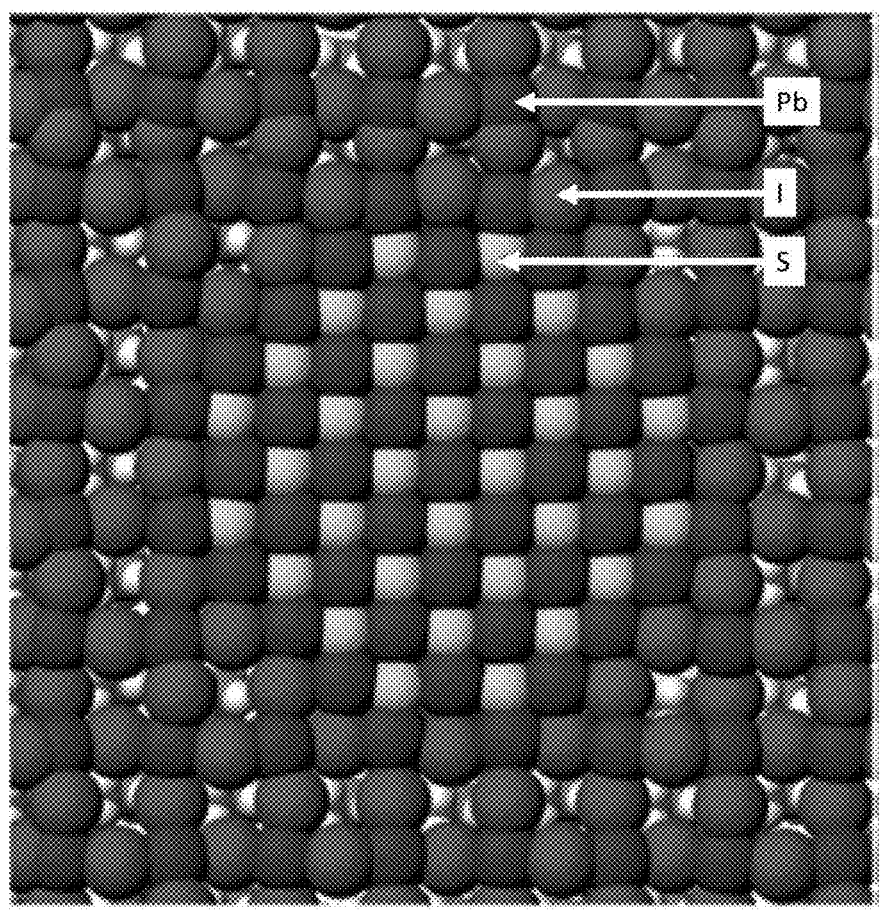
Figure 1C:
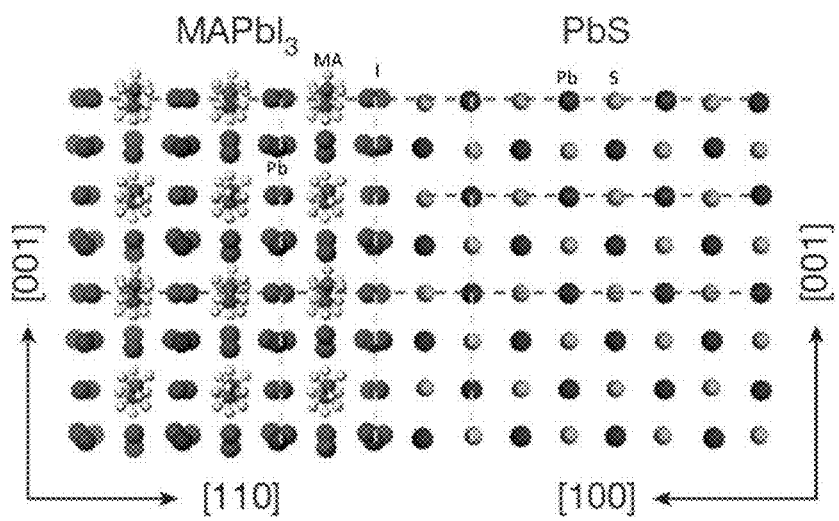
Figure 1D:
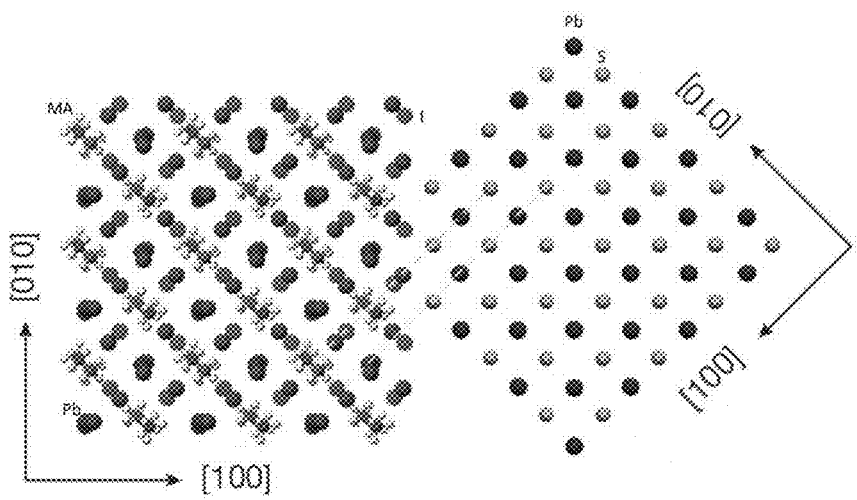

FIGS. 1A-1D show the results of theoretical modelling of perovskite epitaxial growth on colloidal quantum dots (CQDs), in which FIG. 1A shows an atomistic model of CQDs in perovskite matrix in three dimensional (3D) view, FIG. 1B shows cross-section (2D view) scheme of single CQD in perovskite in which all facets of CQDs can match well with perovskite, and FIG. 1C and FIG. 1D show modelling of PbS and MAPbI$_3$ crystal structure and their interface, showing that perovskite can match well with PbS from both Z axis [001] and X-Y axis [010].

Specifically, the inventors hypothesized that, if formed from a combined, miscible solution phase into solid materials together (FIG. 1), the materials could potentially form PHC solids exhibiting optoelectronic properties that synergize the best features of each constituent material. Structurally, the PbS CQD lattice can match well with the perovskite structure both two-dimensionally (FIG. 1A) and three-dimensionally (FIG. 1B).

To implement atomic-level coherence between the inorganic PbS and the organometallic MAPbI$_3$ phase, we would require an organic-ligand-free strategy for the capping of the PbS nanoparticles. With this in mind, we leveraged the recent synthesis of colloids stabilized not using traditional aliphatic ligands, but instead using halide ligands introduced from the perovskite precursor methylammonium iodide (14, 15).

Figure 5:
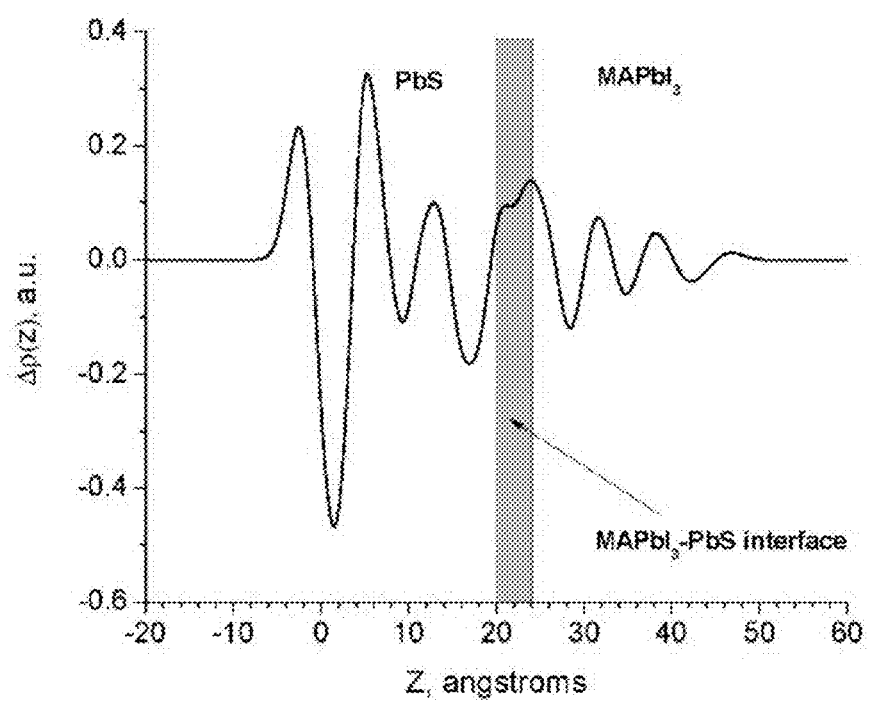
FIG. 5 shows the interface-formation energy in the form of the planar averaged total charge difference between the PbS (100) plane and the perovskite (110) plane. The total charge difference ($\Delta\rho$) is measured along the Z axis of the material.
Figure 6A:
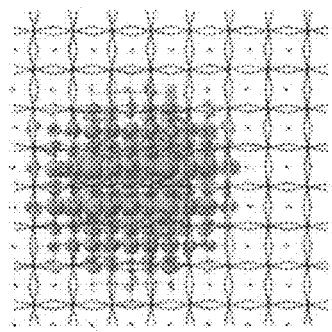
FIG. 6A shows DFT simulations of the highest occupied molecular orbital (HOMO) of a matched CQD.
Figure 6C:
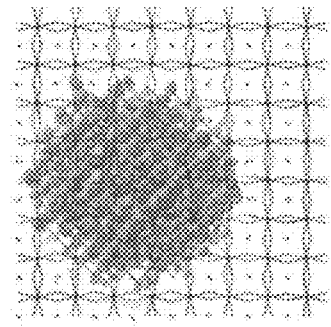
FIG. 6C shows DFT simulations of the highest occupied molecular orbital (HOMO) of an unmatched CQD.
Figure 6B:
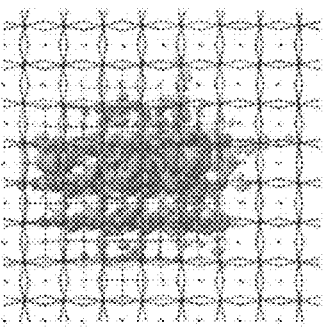
FIG. 6B shows DFT simulations of the lowest unoccupied molecular orbital (LUMO) of a matched CQD.
Figure 6D:
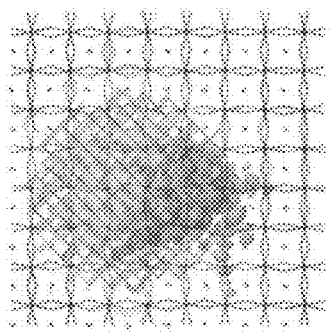
FIG. 6D shows DFT simulations of the lowest unoccupied molecular orbital (LUMO) of an unmatched CQD. The states are mostly localized within the CQD in matched dots, whereas they are localized on the interface between the CQDs and perovskite in mismatched dots, indicating the formation of defects in the latter.
Figure 6E:
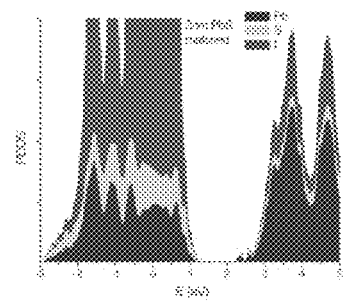
FIG. 6E shows the projected density of states (PDOS) as a function of energy (E) of a matched of a CQD.
Figure 6F:
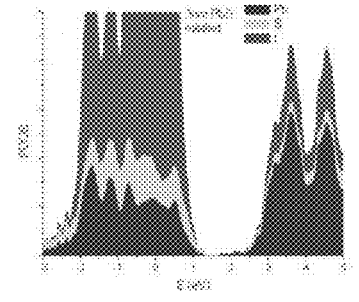
FIG. 6F shows the projected density of states (PDOS) as a function of energy (E) of an mismatched (rotated) CQD.
Figure 7A:
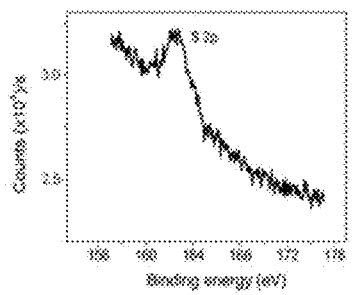
FIG. 7A shows an XPS analysis of the S2p CQDs embedded in PHC film.
Figure 7B:
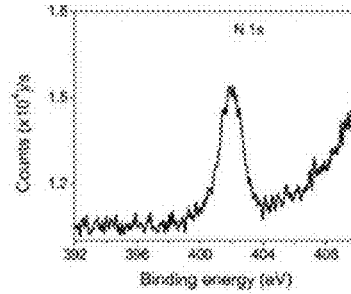
FIG. 7B shows an XPS analysis of the N 1s CQD embedded in PHC film.
Figure 7C:
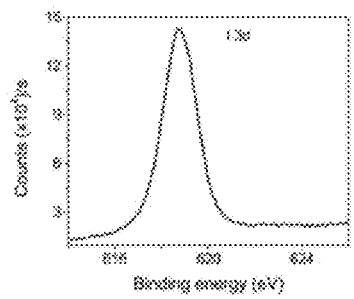
FIG. 7C shows an XPS analysis of the I 3d CQD embedded in PHC film.
Figure 7D:
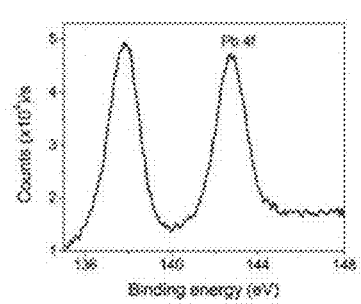
FIG. 7D shows an XPS analysis of the Pb4f CQD embedded in PHC film.
Figure 7E:
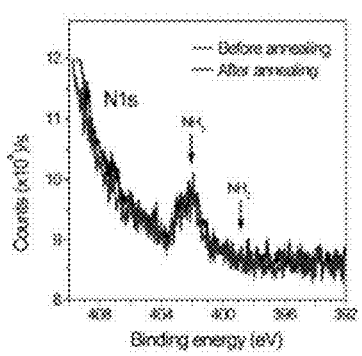
FIG. 7E shows an XPS spectra of the N 1s orbital for high-loading PbS films, which follows the ligand exchange to perovskite ligands in butylamine, before and after annealing at 70° C. for 10 minutes, before the methylammonium posttreatment step. We detect only the ammonium signal at 402 eV and no amine signal at 398-399 eV, which suggests that the methylammonium iodide ligand is more stable on the surface and displaces weakly bound buylamine, even before film annealing.
Figure 7F:
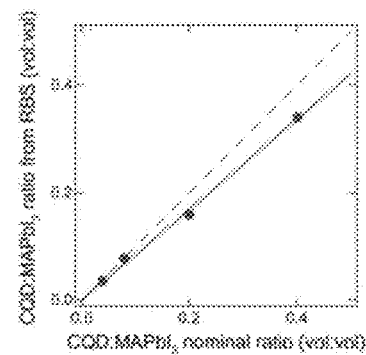
FIG. 7F shows a plot of the nominal volume ratio of CQDs to perovskite versus the ratio measured using RBS (both with the perovskite value scaled to one), with a linear fit (red line) superimposed. The ideal case, where the measured ratio and the nominal ratio are equal, is indicated by the dashed grey line, showing the agreement between the nominal value and the one evaluated using RBS.

Structural affinity alone is necessary but not sufficient to guarantee seamless epitaxial bonding between the two phases: energetic considerations must be taken into account. Here we use density functional theory (DFT) to study the interface formation energy between PbS (100 facet) and perovskite (110 facet) (FIG. 5) (16). The interfacial energy is less than 10 meV/Å$^2$, close to one order of magnitude lower than that of Si (76 meV/Å$^2$), suggesting that the growth of perovskite on PbS at room temperature is almost as feasible as homoepitaxy, e.g. almost as feasible as PbS-on-PbS or perovskite-on-perovskites. DFT further revealed that the epitaxial 3D embedding of PbS CQDs inside a perovskite matrix can be achieved without the formation of interfacial defects (FIG. 1c), i.e. the bandgap is predicted to remain open, with no in-gap defect density of states predicted (FIG. 6).

We therefore proceeded to design a strategy to build PHC solids. We began by exchanging organic ligands on the PbS CQDs to short halide (iodide in this case) anionic ligands. We then mixed these inorganically-terminated CQDs with PbI$_2$ dissolved in butylamine. Since PbI$_2$ forms a complex with iodide and binds to the CQD surface, PbI$_2$ and CQDs were, as expected, well able to mix in solution (transmittance spectra of the colloid showed no loss of optical transmission for photon energies below the CQD bandgap, indicating no increase in scattering and thus no appreciable solution-phase aggregate formation). By controlling the ratio of PbI$_2$ and CQDs, we tuned the CQD-to-perovskite volume ratio across the range 1:400 to 1:4. To fabricate the CQD:MAPbI$_3$ films, we used the sequential method (11), whereby the PbI$_2$:CQD films are initially deposited via spin-coating onto a glass substrate, and these are then soaked in a CH$_3$NH$_3$I/isopropanol solution. (17). X-ray photoelectron spectroscopy (XPS) was used to confirm the presence of both PbS and MAPbI$_3$ in the final film (FIG. 7).

Figures 2A, 2B, 2C:
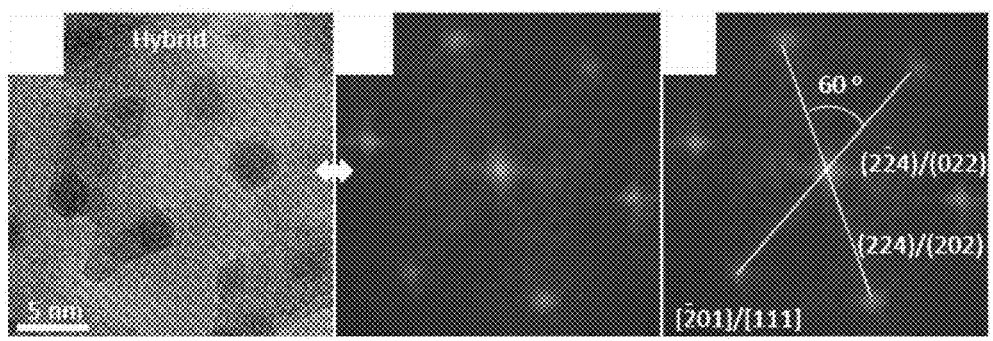
FIG. 2A shows a high resolution transmission electron microscopy (HRTEM) image of colloidal quantum dot (CQD):Perovskite hybrid materials.
FIG. 2B shows the Fourier Transformed (FT) images of the hybrid material shown in FIG. 2A.
FIG. 2C shows an annotated Fourier Transform image of the hybrid materials shown in FIG. 2A.

High-resolution transmission electron microscopy (HR-TEM) was used to characterize the crystal structure and orientation of both CQDs and perovskite matrix for a sample with volume ratio: 1 to 22. Since MAPbI$_3$ is an organic/inorganic hybrid material with lower density than PbS, it shows much lower contrast than inorganic CDQs, thus facilitating the identification of the latter (FIG. 2A).

Figures 2D, 2E, 2F:
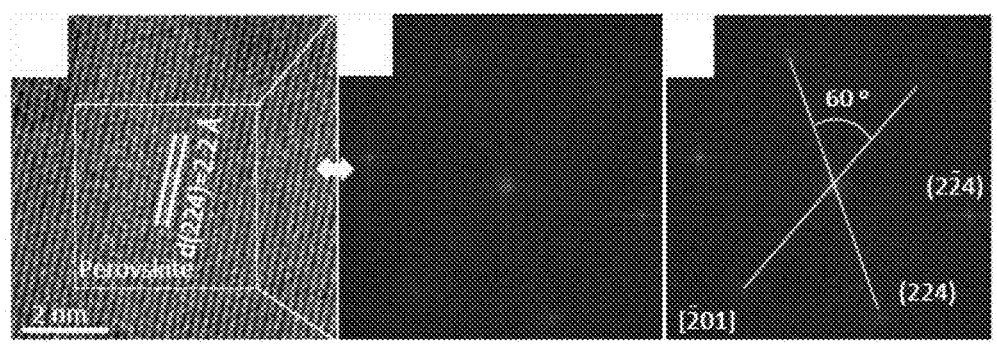
FIG. 2D is a high resolution transmission electron microscopy (HRTEM) image showing the perovskite inside the hybrid material.
FIG. 2E is a Fourier Transformed image of the perovskite inside the hybrid material shown in FIG. 2D.
FIG. 2F is an annotated Fourier Transformed Image of the perovskite inside the hybrid material shown in FIG. 2D.
Figures 2G, 2H, 2I:
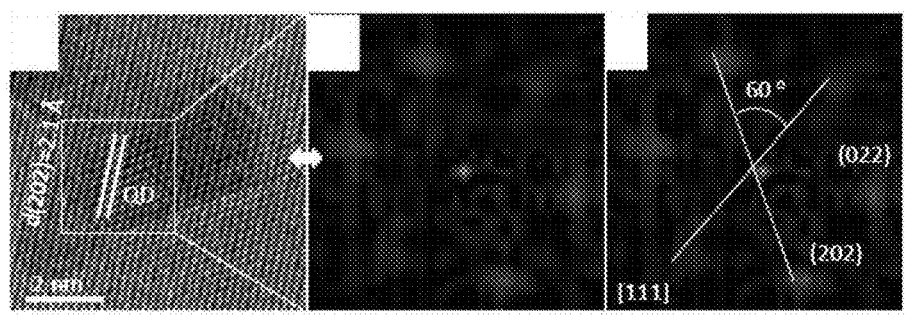
FIG. 2G is a high resolution transmission electron microscopy (HRTEM) image showing the CQDs inside the hybrid material.
FIG. 2H shows a Fourier Transformed image of the CQDs inside the hybrid material shown in FIG. 2G.
FIG. 2I shows an annotated Fourier Transformed Image of the CQDs inside the hybrid material shown in FIG. 2G. The volume ratio of the CQD and perovskites is 1:22. For the perovskite, the lattice fringes are indexed to the (224) facets. For CQD, the lattice fringe is indexed as (022) facet. In real space, the d-spacing value of the (224) facet of perovskite (2.2 Å) matches well with the (111) facet of PbS (2.1 Å). This is consistent with the modeling, which shows that the (100) facet of PbS matches well with (110) facet of perovskite. The fast fourier transform (FFT) image shows the same intersection angle (60 degree) for both perovskite and CQDs, indicating that they can match not only two dimensionally, but also three dimensionally, confirming again that perovskite and CQDs have the same orientation.

Well-defined lattice fringes with 2.2 Ångstrom separation (FIG. 2D) can be indexed to the (224) facet of the matrix, as confirmed using Fast Fourier transform (FFT) images (FIGS. 2E and 2F) which show that the real-space HRTEM image is projected along the [2$\overline{2}$4] zone axis. We also measured the lattice fringes of the CQDs which show the same lattice spacing and can be indexed as the (022) facet of PbS (2.1 Ångstrom), (FIG. 2G, 2H, 2I). This is consistent with the simulations that show how the (100) facet of PbS matches well with (110) facet of perovskite. Strikingly, from FFT, the facet angles between (224) and [201] of the perovskite are the same as between the (022) and [111] facets of PbS. Hence, the orientation relationships between MAPbI$_3$ and CQDs can be identified as below:

$$(022)_{PbS}//(224)_{MAPbI3}; [111]_{PbS}//[201]_{MAPbI3}.$$

Figure 8A:
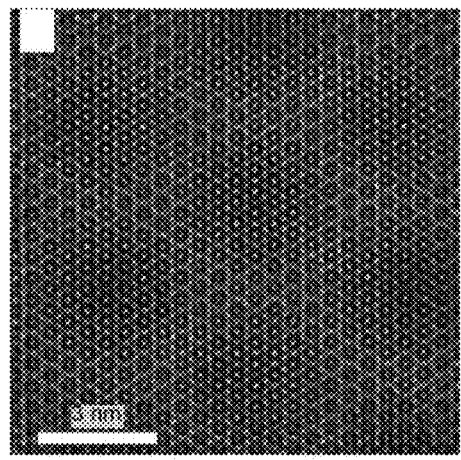
FIG. 8A shows simulated TEM images of matched CQDs and perovskite.
Figure 8B:
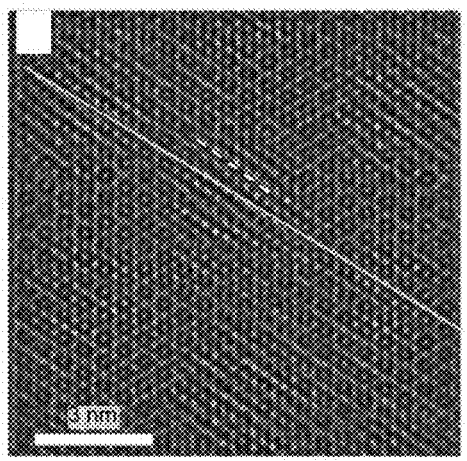
FIG. 8B shows simulated TEM images of unmatches CQDs and perovskite. White line, perovskite lattice plane; white, dashed line, CQD lattice plane.
Figure 9A:
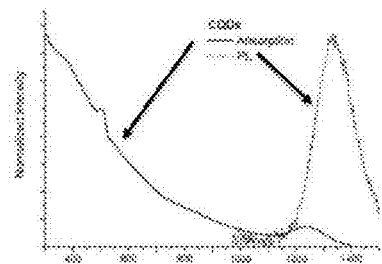
FIG. 9A shows Absorption and photoluminescence (PL) spectra for a pure CQD film.
Figure 9B:
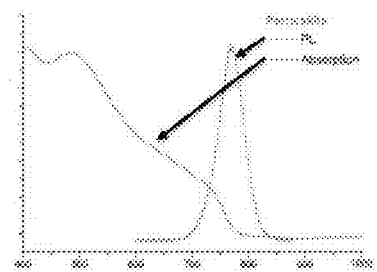
FIG. 9B shows Absorption and photoluminescence (PL) spectra for a pure perovskite film.
Figure 9C:
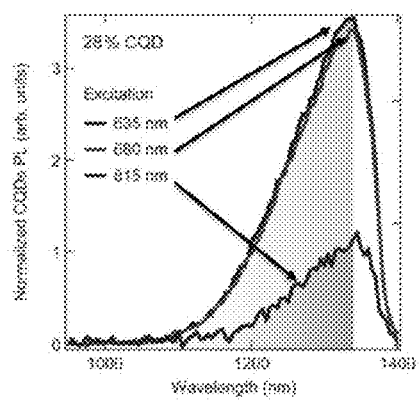
FIG. 9C shows CQD photoluminescence signal from PHC films with 28% CQD concentration, acquired at 635 nm, 680 nm, and 815 nm.
Figure 9D:
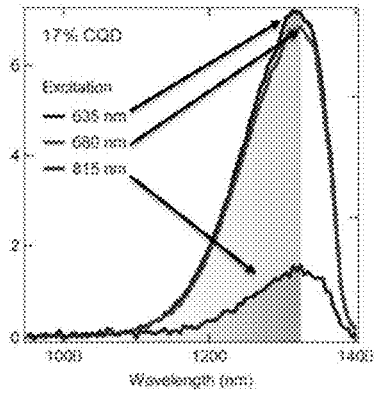
FIG. 9D shows CQD photoluminescence signal from PHC films with 17% CQD concentration, acquired at 635 nm, 680 nm, and 815 nm. The photoluminescence signal has been normalized by the excitation intensity at the different wavelengths used.
Figure 9E:
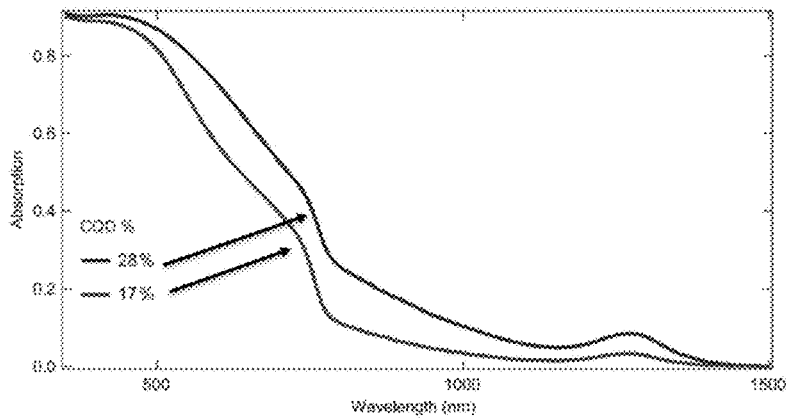
FIG. 9E shows corresponding optical absorption spectra for a CQD concentration of 28% and 17%.

From this we can conclude that the matrix and CQDs show the same orientation, readily observed both in real-space microscope images and confirmed using FFT. This analysis, demonstrates epitaxial alignment between perovskite and CQDs. TEM simulations confirm that, in the presence of epitaxially-connected CQDs and perovskite, the lattice fringes should coincide (FIG. 8) (18). These TEM simulations also indicate that HRTEM will reveal any misalignment among CQDs and perovskite.

Figure 3A:
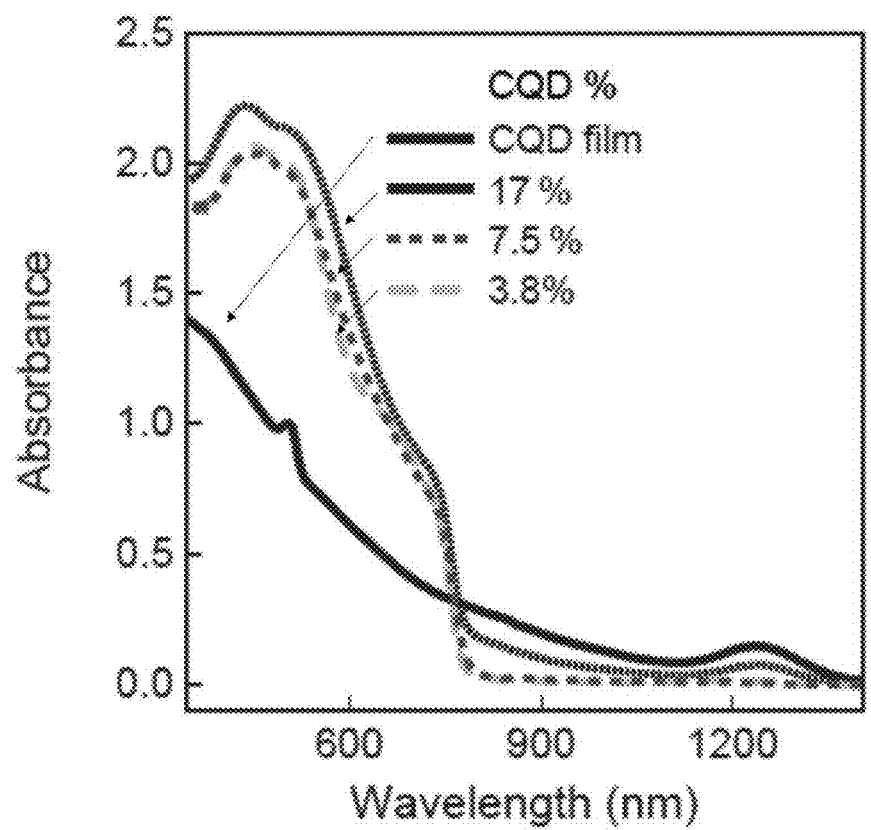
FIG. 3A shows the optical absorption spectra of the CQDs, the perovskites and the hybrid material with volume ratios 17%, 7.5%, and 3.8%.
Figure 3B:
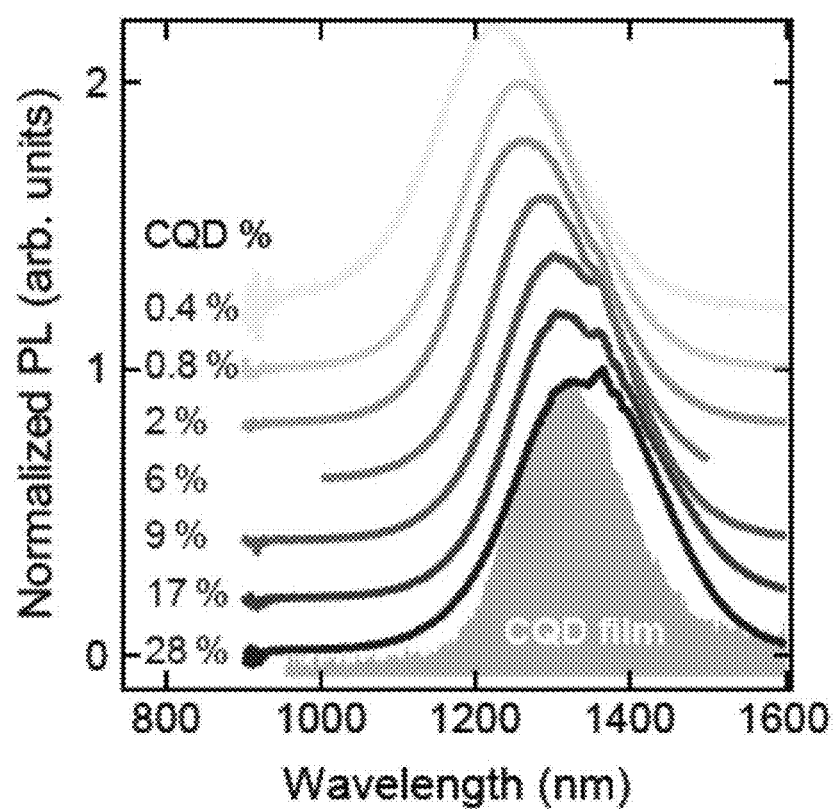
FIG. 3B shows the photoluminescence spectra of the CQDs in film form and the hybrid materials with varying volume ratios.
Figure 3C:
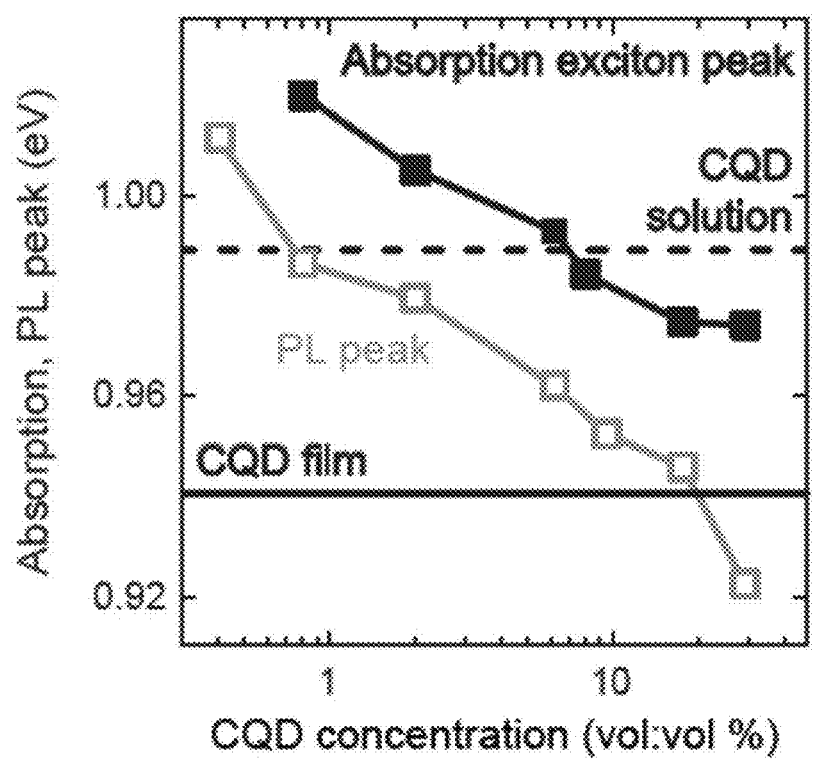
FIG. 3C shows the absorption (red filled squares) and photoluminescence exciton peak positions (orange open squares) for the CQDs as a function of CQD:$MAPbI_3$ ratio (illustrated via the CQD volume percentage). The horizontal lines indicate the photoluminescence emission energy for pure CQD films (solid) and solutions (dashed)
Figure 3D:
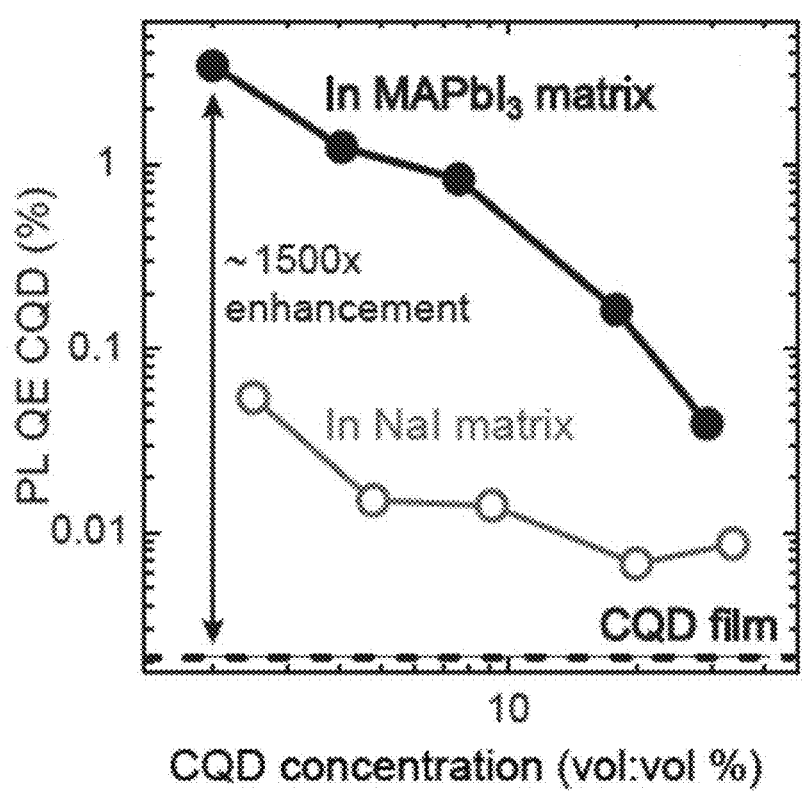
FIG. 3D shows the PLQE of CQDs in the hybrid material with perovskites and with NaI.

The optical absorption spectra for pure CQD films and for the new dot-in-perovskite PHCs are shown in FIG. 3A. FIGS. 3A, & 3B show the matrix-tuned absorption (FIG. 3A) and photoluminescence (FIG. 3B) of CQD:perovskite hybrid. After the growth of perovskite, a representative absorption edge around 770 nm appears, while both absorption and photoluminescence (PL) CQD exciton peaks are preserved, indicating that the properties of CQDs remain unaltered. FIG. 3C shows absorption and PL exciton peak position of CQDs as a function of CQD:MAPbI$_3$ ratio. Both are blue shifted when the CQD concentration is reduced, most likely due to the strain between CQDs and perovskite, again confirming the epitaxial growth of MAPbI$_3$ on CQDs. FIG. 3D shows PL quantum efficiency (PL QE) of CQDs in matrix. For lower CQD concentration the PL QE is increased, indicating that CQDs are well dispersed in the matrix and carrier dissociation between CQDs is blocked. In the MAPbI$_3$ matrix, the PL QE is two orders of magnitude higher than that in a NaI matrix, which reveals that a lattice-mismatched matrix (8.8% mismatch for NaI) cannot grow on PbS. This finding confirms that epitaxial growth of matrix on CQDs is critical for CQD surface passivation.

The absorption signatures corresponding to each constituent, perovskite and CQD, are readily apparent in the hybrid films (FIG. 3A). The photoluminescence spectra show emission proper to CQDs (FIG. 3B), indicating that the photophysical property of CQDs are kept intact when the CQDs are incorporated into the perovskite matrix. As the CQD concentration is lowered, the exciton absorption and emission peaks are concomitantly blue-shifted (FIG. 3C). This phenomenon may arise from tensile strain caused by the slight lattice mismatch between CQDs and perovskite (19). Another possibility is reduced coupling among CQDs (20).

We then turned to investigating the CQD photoluminescence (PL) quantum efficiency for a series of samples having different CQD:perovskite ratios. Initially we employed an excitation wavelength of 815 nm, i.e. below the absorption edge of the perovskite (FIG. 3D), to excite the quantum dot phase directly and exclusively. The photoluminescence quantum efficiency (PLQE) is highest in low-dot-concentration samples, consistent with minimal coupling-induced quenching among dilute quantum dots. The highest PL quantum yield is 3.4%, which is fully two orders of magnitude higher than that in the pure CQD film. As a control to study the importance of lattice matching on photophysical properties, we changed the matrix to sodium iodide (NaI) (8.8% lattice mismatch with PbS): the PL quantum yield value of CQDs in a NaI matrix is two orders of magnitude lower than in perovskite matrix (FIG. 3D).

To elucidate the physical origins of enhanced PL efficiency, we used DFT to investigate whether CQD surfaces can in principle be passivated by the perovskite matrix. Both the highest occupied molecular orbital (HOMO) and lowest unoccupied molecular orbital (LUMO) are located in the core of PbS CQDs, and the bandgap is trap-free. In contrast, for a CQD misaligned with the perovskite matrix, trap states are induced at the CQD surface, mostly on the conduction band side, see Figure S2).

Figure 4A:
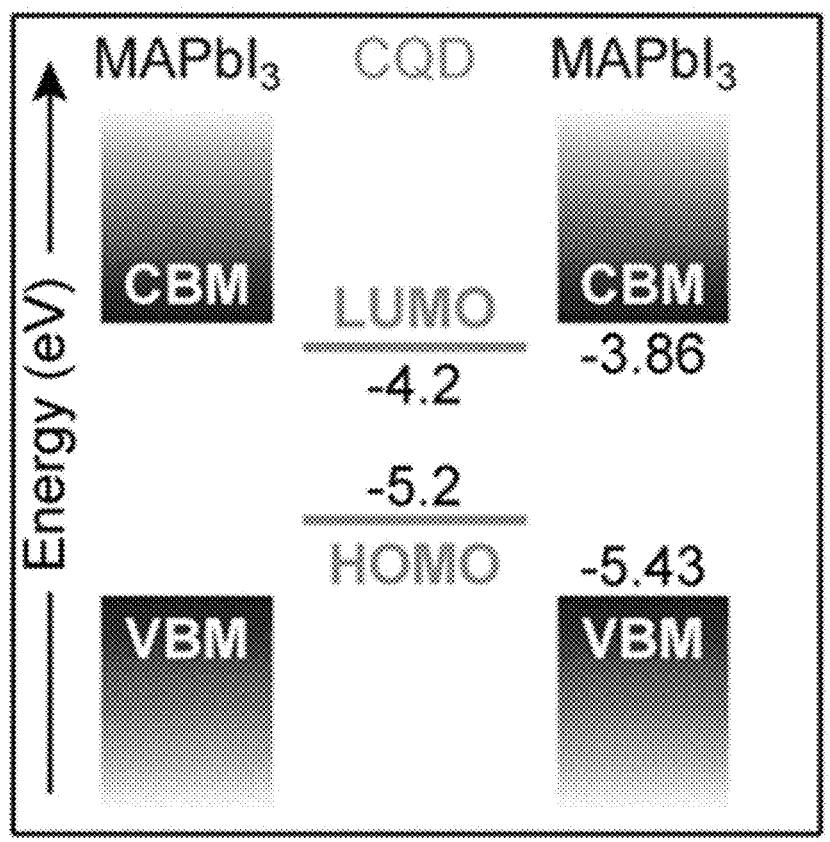
FIG. 4A shows the band alignment of the perovskites and CQDs forming a Type I heterostructure.
Figure 4C:
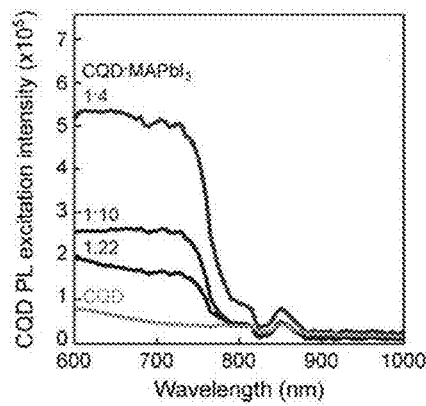
FIG. 4C shows the photoluminescence spectra of $MAPbI_3$ for PHC films.
Figure 4C:
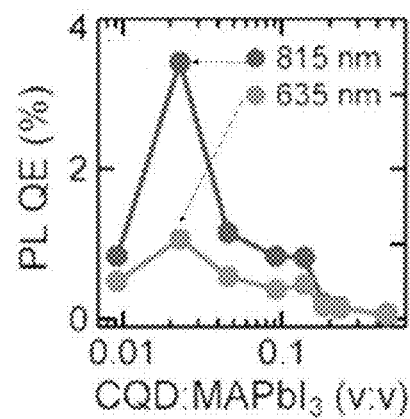
Figure 4C:
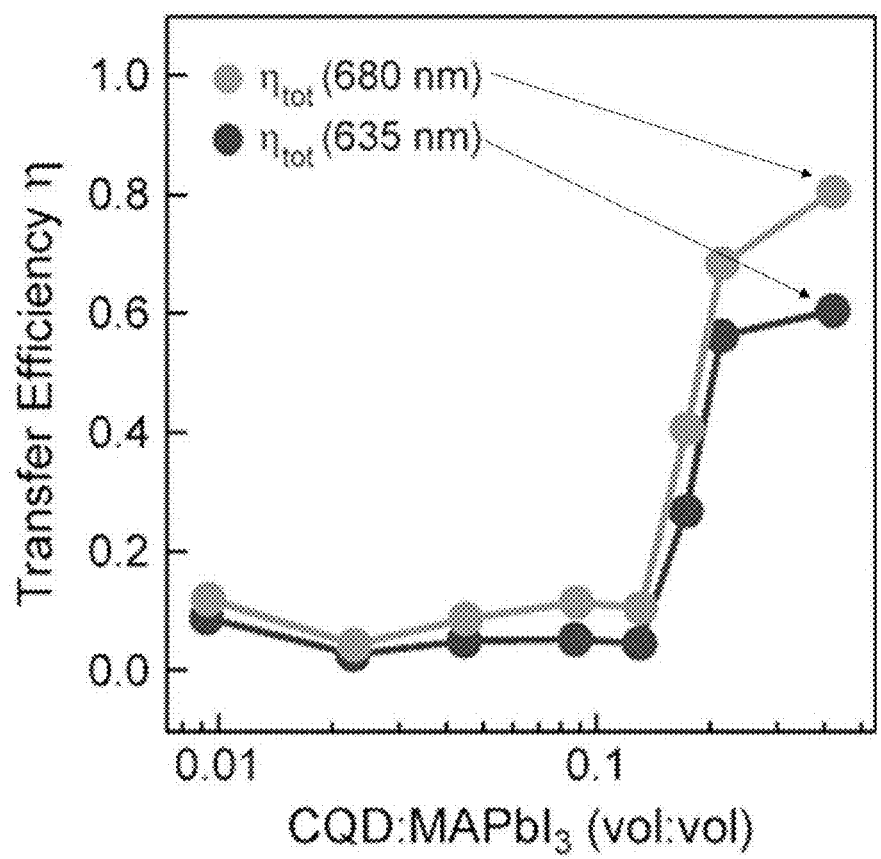
Figure 4D:
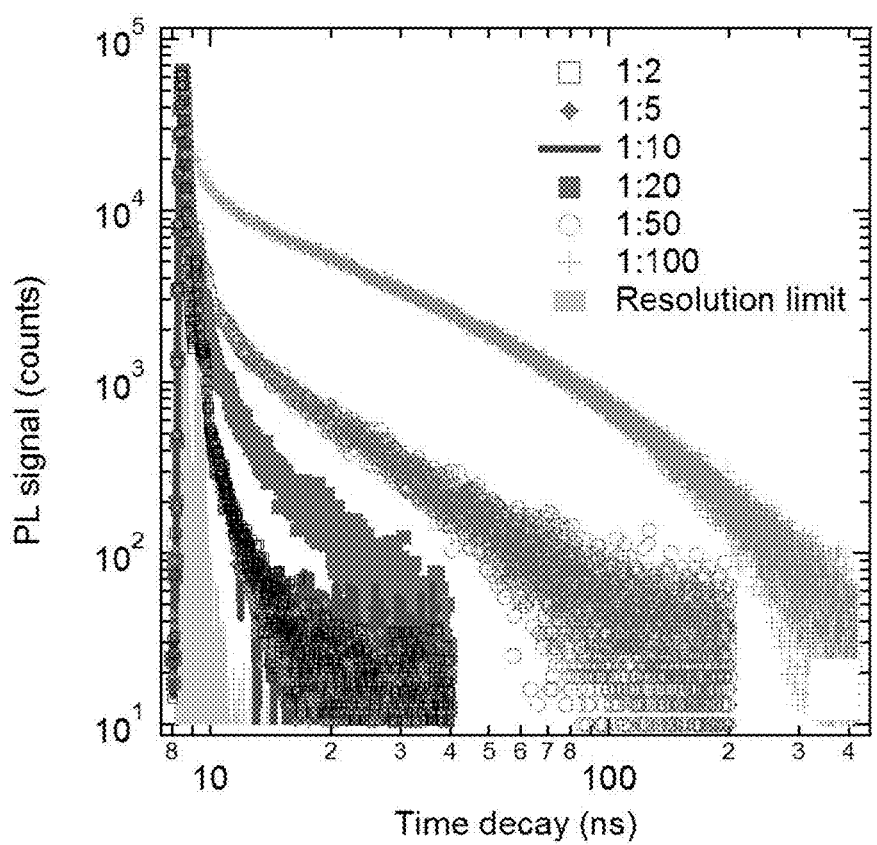
FIG. 4D shows the transient photoluminescence emission from $MAPbI_3$.
Figure 4E:
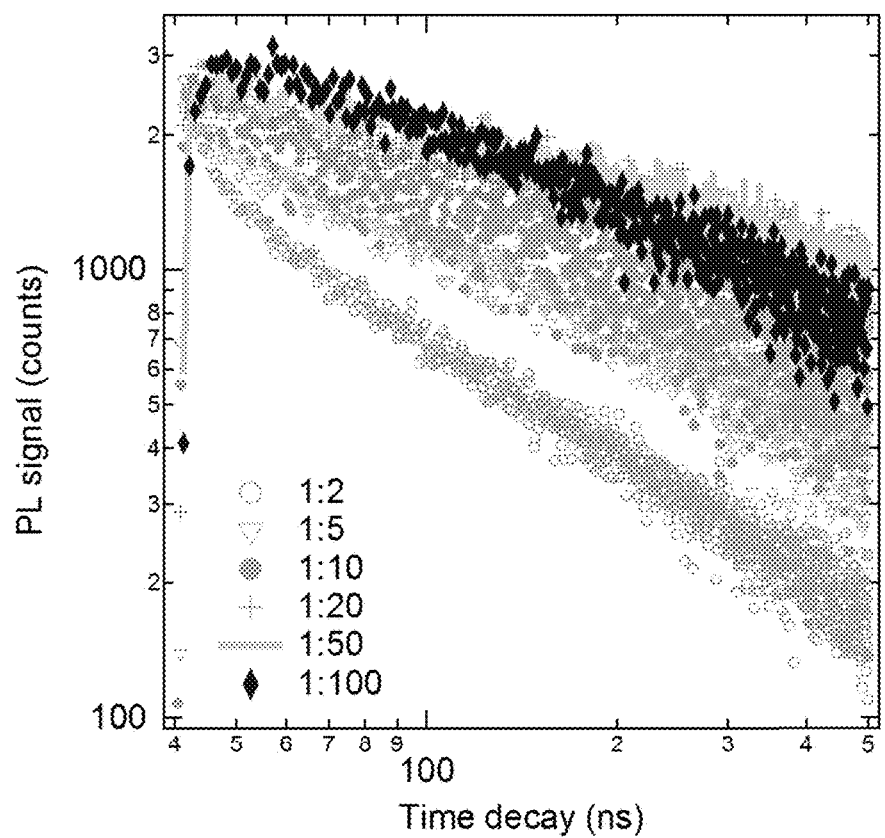
FIG. 4E shows the transient photoluminescence emission from CQDs.
Figure 4F:
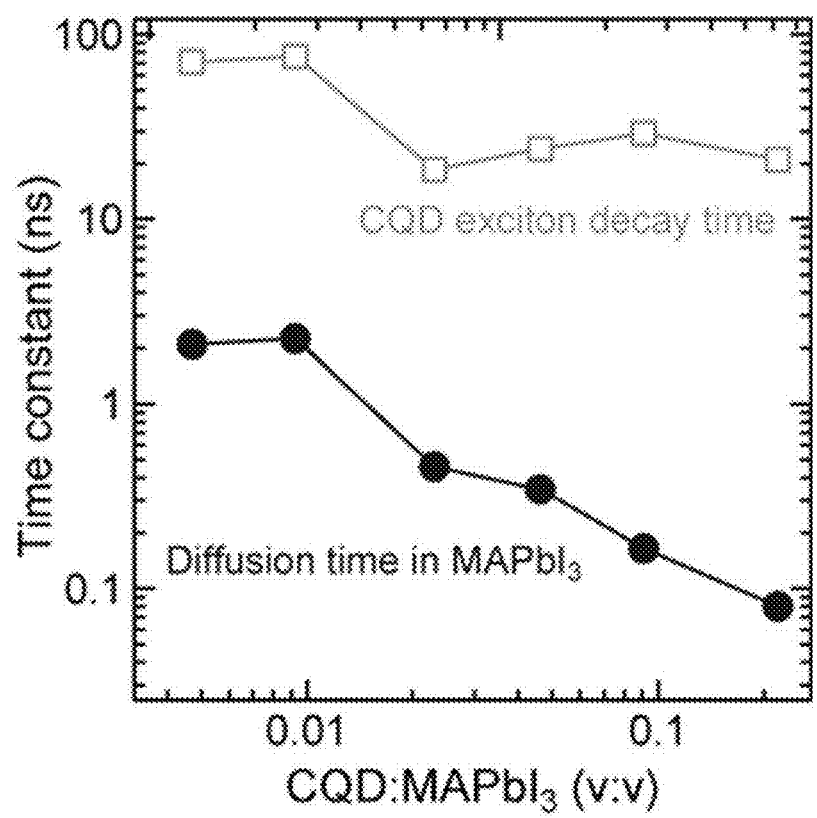
FIG. 4F shows the transient photoluminescence emission from corresponding time constants.

FIGS. 4A-4F show carriers transfer from perovskite to CQDs. FIG. 4A shows the electronic band structure of CQDs and perovskite. The LUMO level of CQD is lower than the conduction band of perovskite and the HOMO level position of CQD is higher than the valence band of perovskite, making the transfer of both carriers from perovskite to CQDs energetically favored. FIG. 4B shows the CQDs PL excitation spectra. In the perovskite absorption region ($\lambda$<780 nm), for increasing perovskite content the PL excitation intensity is enhanced, indicating that carriers excited in perovskite are transferred to CQDs. However, considering the partial carrier loss (via recombination) in perovskite, the PL QE of the hybrid is lower than the internal PL QE of CQD when long excitation wavelength is used (inset). FIG. 4C shows the total charge transfer efficiency ($\eta_{tot}$) from MAPbI$_3$ to CQDs. For increasing CQD concentration, the charge transfer efficiency is considerably increased. FIGS. 4D-4F show PL decay traces for MAPbI$_3$ (FIG. 4D) and CQDs (FIG. 4E) and corresponding time scales (FIG. 4F). As the CQD:MAPbI$_3$ is reduced, the initial PL decay time of both perovskite and CQDs become longer, as a result of longer transit time in the matrix and reduced carriers dissociation across the CQDs, respectively.

In principle, the material can be formed with any band alignment between the materials. One example is a Type 1 heterojunction (see FIG. 4A), with the particles having smaller bandgap than the matrix. Charge carriers can be transported through the matrix and be injected into the particles, where they radiatively recombine. This design is of use for light emitting devices. For example, quantum tuned PbS particles with <1 eV bandgap embedded in methylammonium lead iodide perovskite is one example.

Another example is a Type 2 heterojunction, with the offset in both conduction and valence bands larger enough that one carrier is trapped in the particle while the other carrier is transferred to the matrix. This design is of use for photodetectors. For example, quantum tuned PbS particles with >1.7 eV bandgap embedded in methylammonium lead iodide perovskite.

Yet another example is a Type 2 heterojunction, with the offset in one band such that the carrier in that band is transferred to the matrix. The offset in the other band and the distance between particles are both small enough such that the carrier in that band can hop between particles. This allows separation of charge carriers but transport of each. This design is of use for photovoltaic devices.

In principle, the material can be formed with materials of any bandgap. In non-limiting examples, the matrix bandgap can range from 1.4 eV to over 2 eV. The particle bandgap can range from 0.5 eV to over 2 eV. A wide bandgap matrix (>1.5 eV) with smaller bandgap particles (<1.3 eV) embedded therein is preferred for light emission to achieve efficient transfer of carriers into the embedded particles. For example, quantum tuned PbS particles with <1 eV bandgap embedded in methylammonium lead iodide perovskite with 1.6 eV bandgap is one example.

The volume ratio of the embedded particles to the matrix material may vary over a wide range, for example the broadest range may be such that the semiconductor particles are present in the perovskite matrix material in a volume ratio of about 0.001% to about 80%. However a range from about 0.1% to about 50% may be preferred depending on the application at hand for the composite.

In other words, the volume percentage of particle inclusions can span a wide range for different applications. For example, in low volume percentage regimes (<2% volume of particles relative to the matrix), the particles are well separated and more charge carriers are transferred from the matrix. Coupling between particles is prevented due to the low density of the particles in the matrix. The photoluminescence quantum yield is high. This regime is preferred for light emission.

In a medium volume percentage regime (about 2% to about 10% volume of particles in the matrix), increased coupling between particles can lead to a redshifting of luminescence, see FIGS. 3B-3D. In this regime the density of injected carriers per particle is reduced, leading to reduced Auger recombination. This regime is preferred for light emission at high injection intensities.

For high volume percentage regimes (>10% volume of particles in the matrix), particles become well coupled and charge carriers can transport between them, increasing conductivity while maintaining surface passivation by the matrix. This regime is preferred for photovoltaic and photodetector applications.

As will be illustrated in the Examples below, the semiconducting matrix may be formed: a) in one step from a solution containing all precursors; b) in multiple steps, with a matrix formed from one or more precursors formed during the first step, followed by reacting with remaining precursors in solution; or c) in multiple steps, with a matrix formed from one or more precursors reacted with remaining precursors in vapor phase.

In addition to providing passivation, the matrix:dot interface will be the critical enabler of any carrier injection into, or extraction from, the CQDs. To study excitation transfer across this interface, we relied on ~4 nm diameter CQDs (bandgap of 1 eV) whose LUMO energy level is predicted to lie below the conduction band of the perovskite, and whose HOMO should reside above the valence band edge of the perovskite (FIG. 4A).

By exciting charges in the dots (using long wavelengths) or in principally in the perovskite matrix, we would investigate carrier transfer to, and across, the CQD:perovskite interface. Photoluminescence excitation spectra (PLE, FIG. 4B) reveal enhanced CQD emission when the perovskite is excited ($\lambda_{excitation}$≲780 nm). Increased perovskite content drives a higher CQD PL intensity when the excitation occurs in the perovskite absorption region, and at the same time perovskite PL is significantly reduced (FIG. 9).

Qualitatively we conclude that photocarriers excited in the perovskite are transferred to CQDs. Quantitatively, we can estimate the energy transfer efficiency from perovskite to CQDs from experimentally measured PLQE and absorbance for the perovskite matrix and the CQDs (FIG. 4C).

With increasing CQD concentration and therefore reduced inter-dot spacing, the energy transfer efficiency from perovskite to CQDs is improved since photocarriers need to diffuse over a shorter distance within the perovskite matrix. The energy transfer efficiency is maximized for a CQD to perovskite volume ratio of 1 to 2, and attains a remarkable value exceeding 80%.

We investigated the carrier dynamics in the PHC using PL decay (FIG. 4D-4E). We used a two-temporal-component model to analyze transient PL. The fast decay transient in CQDs is assigned to fast carrier dissociation between neighboring CQDs, while the longer dynamics are ascribed to radiative recombination. The exciton dissociation time grows as the CQD concentration is reduced and correspondingly the inter-dot separation increased, consistent with the expected suppression in the exciton dissociation rate for more isolated dots. Similarly, the initial fast decay in the perovskite PL lifetime also grows for lower CQD concentration. This we explain through the fact that transit across greater spans of matrix takes longer (FIG. 4F). The reduction in the charge transfer time for higher CQD concentrations causes a larger fraction of carriers to be transferred to the dots and explains the enhanced energy transfer efficiency.

In the composite materials produced herein, depending on the end application, the pre-formed semiconductor particles may have a size in a range from about 1 nm to 100 µm. However, the particles may have ranges from 2 nm to 50 µm, 2 nm to 1 µm, or from 2 nm to about 300 nm, or 1 nm to about 30 nm, or from about 2 nm to about 12 nm.

The method and composite materials produced in accordance with the present disclosure will be further illustrated by the following exemplary non-limiting examples.

EXAMPLE 1

PbS QDs Preparation.
(a) Synthesis of Oleic Acid Capped QDs in Non-Polar Solvent.

Bis(trimethylsilyl) sulphide (TMS, synthesis grade) (0.18 g, 1 mol) was added to 1-octadecene (ODE) (10 ml) that had been dried and degassed by heating to 80° C. under vacuum for 24 h. A mixture of oleic acid (1.34 g, 4.8 mmol), PbO (0.45 g, 2.0 mmol) and ODE (14.2 g, 56.2 mmol) was heated to 95° C. under vacuum for 16 h and placed under Ar. The flask temperature was increased to 120° C. and the TMS/ODE mixture was injected. After injection, the flask was allowed to cool gradually to 35° C. The nanocrystals were precipitated using distilled acetone (50 ml) and centrifuged. The supernatant was discarded and the precipitate redispersed in toluene. The nanocrystals were precipitated again using acetone (20 ml), centrifuged (5 min), dried, dispersed in toluene (50 mg ml$^{-1}$).

(b) For iodide ligand exchange and transfer to polar solvent, 3 ml of CQDs dispersed in octane (10 mg ml$^{-1}$) were added into 3 mL of dimethylformamide (DMF) solution containing 350 mg of PbI$_2$ and 150 mg of CH$_3$NH$_3$I. After stirring for 10 min, CQDs had transferred from the top octane phase to the bottom DMF. After removing the octane, the CQD solution was washed three more times using octane to remove the organic residue. Subsequently, the CQDs were precipitated by the addition of toluene. The nanoparticles were dispersed in butylamine for film fabrication.

c) Preparation of PHC Films Using a 2-Step Method where the PbI$_2$CQD Films are Spin-Cast onto a Glass Substrate, and then Soaked in a CH$_3$NH$_3$I/Isopropanol Solution.

PbI$_2$ (with one quarter weight ratio of CH$_3$NH$_3$I) is added into the QD solution. A spin-coating process is used for the precursor film fabrication (spin speed of 6,000 r.p.m). The film was then annealed at 70° C. for 10 min in a N$_2$ glovebox. To convert the PbI$_2$ matrix into perovskite, methylammonium iodide solution (10 mg ml$^{-1}$ in isopropanol) was dropped and left on the film for 30 s. After spinning off the solution (spin speed 6,000 r.p.m.), the film was soaked in pure isopropanol for 10 s, and the residual solvent spinned off. Finally, the film was annealed again at 70° C. for 10 min in a N$_2$ glovebox.

EXAMPLE 2

Preparation of Dots-in-Perovskite Films Using a 1-Step Method

Ligand-exchanged colloidal quantum dots from example 1 are, in place of step (c), mixed with the perovskite precursors (PbI$_2$ and CH$_3$NH$_3$X, X=I, Br or Cl, in a 1:1 molar ratio) dissolved in dimethylformamide. The solution is then used for spin-casting the film (spin speed of 6,000 r.p.m for 60 s). During the spin-casting process, anti-solvent (e.g. toluene) was dropped onto the film, to facilitate perovskite crystallization process.

EXAMPLE 3

PbS Dots in NaI Matrix

Ligand-exchanged colloidal quantum dots from example 1 are, in place of step (c), mixed with the sodium iodide (NaI) solution in butylamine. The solution is then used for spin casting the film (spin speed of 6000 r.p.m for 10 s).

Although the foregoing invention has been described in some detail by way of illustration and example for purposes of clarity of understanding, one of skill in the art will appreciate that certain changes and modifications may be practiced within the scope of the appended claims.

REFERENCES

1. U. W. Pohl, Epitaxy of Semiconductors, *Springer*, (2013).
2. W. P. McCray, *Nat. Nanotech.* 2, 259 (2007).
3. M. H. Huang, et al, *Science*, 292, 1897 (2001).
4. K. Choi, S. Kako, M. J. Holmes, M. Arita, and Y. Arakawa, *Appl. Phys. Lett.* 103, 171907 (2013).
5. H. Adhikari, A. F. Marshall, C. E. D. Chidsey, and P. C. McIntyre, *Nano Lett.*, 6, 318 (2006).
6. Y. Diao, et al., *Nat. Mater.* 12, 665 (2013).
7. Y. Shirasaki, G. J. Supran, M. G. Bawendi, & V. Bulović, *Nat. Photonic,* 7, 13, (2013).
8. M. Grätzel, R. A. J. Janssen, D. B. Mitzi, E. H. Sargent, *Nature,* 488, 304 (2012).
9. D. V. Talapin, J. Lee, M. V. Kovalenko, and E. V. Shevchenko. *Chem. Rev.* 110, 389 (2010).
10. W. Ma, J. Luther, H. Zheng, Y. Wu, P. Alivisatos, *Nano Lett.* 9, 1699 (2009).
11. J. Burschka, et al., *Nature* 499, 316 (2013).
12. Z. Tan, et.al *Nat. Nanotech.* 9, 687, (2014).
13. S. D. et.al *Science* 342, 341, (2013).
14. Z. Ning, H. Dong, Q. Zhang, O. Voznyy, and E. H. Sargent, *ACS Nano,* 8, 10321, (2014).
15. D. N. Dirin, et al., *J. Am. Chem. Soc.,* 136, 6550 (2014).
16. Leitsmann, R.; Bhm, O.; Plnitz, P.; Radehaus, C.; Schaller, M.; Schreiber, M. *Surf. Sci.* 604, 1808 (2010).
17. See supplementary materials on *Science* Online 18. C. Koch thesis. QSTEM software. Arizona State University. (2002).
19. Frank W. Wise, *Acc. Chem. Res.*, 33, 773 (2000).
20. P. Moroz, et al. *ACS Nano*, 7, 6964-6977 (2013).

What is claimed is:
1. A composite material, comprising:
pre-formed crystalline or polycrystalline particles embedded in a crystalline or polycrystalline matrix material, wherein the pre-formed crystalline or polycrystalline particles include lattice planes and the crystalline or polycrystalline matrix material include lattice planes, said pre-formed crystalline or polycrystalline particles and said crystalline or polycrystalline matrix material being selected so that any lattice mismatch between the two lattice planes does not exceed 10%, said pre-formed crystalline or polycrystalline particle lattice planes and said crystalline or polycrystalline matrix material lattice planes being substantially aligned such that the pre-formed crystalline or polycrystalline particles and said crystalline or polycrystalline matrix material are substantially atomically aligned.
2. The composite material according to claim 1 wherein said pre-formed crystalline or polycrystalline particles are semiconductor particles, and wherein said crystalline or polycrystalline matrix material is a semiconductor material.
3. The composite material according to claim 1 wherein said crystalline or polycrystalline matrix material is any one of ZnS, ZnSe, CdS, ZnTe, CdSe, $PbI_2$, $CdI_2$, NaI, NaBr, NaCl, KI, KBr, KCl, CsI, CsBr, CsCl, and $Cs_4PbBr_6$.
4. The composite material according to claim 2 wherein said semiconductor particles are any one of PbS, PbSe, PbTe, PbSSe, $CsPbI_3$, $CsPbBr_3$, CdS, CdSe, CdTe, SnS, SnSe, SnTe, HgTe, FeO, NiO, $TiO_2$, ZnO, ZnS, ZnSe, ZnTe, $Bi_2S_3$, $Bi_2Se_3$, $Bi_2Te_3$, Si, Ge, GaAs, GaN, GaP, GaSb, GaPAs, CuO, $Cu_2O$, $CuInS_2$, $CuInSe_2$, CuInSSe, $CuZnSnS_4$, InAs, InSb, InP, CuInP, CdSeTe, and Mn-doped ZnTe.
5. The composite material according to claim 2 wherein said crystalline or polycrystalline matrix material is a perovskite.
6. The composite material according to claim 5 wherein said perovskite is a perovskite material of form $A_2MX_4$, $AMX_3$, $ANX_4$, or $BMX_4$, wherein
A is a monovalent cation or combination of monovalent cations selected from Li, Na, K, Rb, Cs, Fr, and primary, secondary, tertiary or quaternary organic ammonium compounds containing 1 to 15 carbons,
B is a divalent cation or combination of divalent cations selected from Mg, Co, Ca, Cd, Sr, Ba and primary, secondary, tertiary or quaternary organic ammonium compounds having 1 to 15 carbons,
M is a divalent metal cation or combination of divalent metal cations selected from Pb, Sn, Cu, Ni, Co, Fe, Cr, Pd, Cd, Eu, Yb, Ge,
N is selected from Bi and Sb, and
X is a monovalent anion or combination of monovalent anions selected from I, Br, Cl, SCN, CN, OCN or $BF_4$.
7. The composite material according to claim 5 wherein said perovskite is any one of $(A)PbI_3$, $(A)PbBr_3$, $(A)PbCl_3$, $(A)PbI_xBr_{(3-x)}$, $(A)PbI_xCl_{(3-x)}$, $(X)PbBr_xCl_{(3-x)}$, $NaPbI_3$ $CsPbI_3$, $CsPbBr_3$, $CsPbCl_3$, $CsPbI_xBr_{(3-x)}$, $CsPbI_xCl_{(3-x)}$, $CsPbBr_xCl_{(3-x)}$, $KPbI_3$, where A is any one of methylammonium ($CH_3NH_3$), ammonium ($NH_4$), formamidium ($CH_2(NH_2)_2$), butylammonium ($C_4H_9NH_3$) and ethylammonium ($CH_3CH_2NH_3$).
8. The composite material according to claim 1 wherein said pre-formed crystalline or polycrystalline particles are present in the crystalline or polycrystalline matrix material in a volume ratio of 0.001% to 80%.
9. The composite material according to claim 1 wherein said pre-formed crystalline or polycrystalline particles have size in a range from 1 nm to 100 μm.
10. The composite material according to claim 1 wherein said pre-formed crystalline or polycrystalline particles are monodisperse.
11. A composite material, comprising:
pre-formed crystalline or polycrystalline semiconductor particles embedded in a crystalline or polycrystalline perovskite matrix material, wherein the pre-formed crystalline or polycrystalline particles include lattice planes and the crystalline or polycrystalline matrix material include lattice planes, said pre-formed crystalline or polycrystalline semiconductor particles and said crystalline or polycrystalline perovskite being selected so that any lattice mismatch between the two lattice planes does not exceed 10%;
said pre-formed crystalline or polycrystalline semiconductor particle lattice plane and said crystalline or polycrystalline perovskite matrix material lattice plane being substantially aligned such that the pre-formed crystalline or polycrystalline particles and said crystalline or polycrystalline matrix material are atomically aligned.
12. The composite material according to claim 11 wherein said perovskite matrix material is a perovskite material of form $A_2MX_4$, $AMX_3$, $ANX_4$, or $BMX_4$, wherein
A is a monovalent cation or combination of monovalent cations selected from Li, Na, K, Rb, Cs, Fr, and primary, secondary, tertiary or quaternary organic ammonium compounds containing 1 to 15 carbons,
B is a divalent cation or combination of divalent cations selected from Mg, Co, Ca, Cd, Sr, Ba and primary, secondary, tertiary or quaternary organic ammonium compounds having 1 to 15 carbons,
M is a divalent metal cation or combination of divalent metal cations selected from Pb, Sn, Cu, Ni, Co, Fe, Cr, Pd, Cd, Eu, Yb, Ge,
N is selected from Bi and Sb, and
X is a monovalent anion or combination of monovalent anions selected from I, Br, Cl, SCN, CN, OCN or $BF_4$.
13. The composite material according to claim 11 wherein said perovskite is any one of $(A)PbI_3$, $(A)PbBr_3$, $(A)PbCl_3$, $(A)PbI_xBr_{(3-x)}$, $(A)PbI_xCl_{(3-x)}$, $(X)PbBr_xCl_{(3-x)}$, $NaPbI_3$ $CsPbI_3$, $CsPbBr_3$, $CsPbCl_3$, $CsPbI_xBr_{(3-x)}$, $CsPbI_xCl_{(3-x)}$, $CsPbBr_xCl_{(3-x)}$, $(C_4H_9NH_3)_2PbI_4$, $(C_4H_9NH_3)_2PbBr_4$, $(C_4H_9NH_3)_2PbCl_4$, $(C_4H_9NH_3)_2PbI_xBr_{(4-x)}$, $(C_4H_9NH_3)_2PbI_xCl_{(4-x)}$, $(C_4H_9NH_3)_2PbBr_xCl_{(4-x)}$, $KPbI_3$, where A is any one of methylammonium ($CH_3NH_3$), ammonium ($NH_4$), formamidium ($CH_2(NH_2)_2$), and ethylammonium ($CH_3CH_2NH_3$).
14. The composite material according to claim 11 wherein said semiconductor particles are any one of PbS, PbSe, PbTe, PbSSe, $CsPbI_3$, $CsPbBr_3$, CdS, CdSe, CdTe, SnS, SnSe, SnTe, HgTe, FeO, NiO, $TiO_2$, ZnO, ZnS, ZnSe, ZnTe, $Bi_2S_3$, $Bi_2Se_3$, $Bi_2Te_3$, Si, Ge, GaAs, GaN, GaP, GaSb, GaPAs, CuO, $Cu_2O$, $CuInS_2$, $CuInSe_2$, CuInSSe, $CuZnSnS_4$, InAs, InSb, InP, CuInP, CdSeTe, and Mn-doped ZnTe.
15. The composite material according to claim 11 wherein said semiconductor particles are metal chalcogenides.
16. The composite material according to claim 11 wherein said semiconductor particles are present in the perovskite matrix material in a volume ratio of 0.001% to 80%.

17. The composite material according to claim 11 wherein said pre-formed semiconductor particles have a size in a range from 1 nm to 100 μm.

18. The composite material according to claim 11 wherein said pre-formed semiconductor particles have a size in a range from 2 nm to 12 nm.

19. The composite material according to claim 11 wherein said semiconductor particles are present in the perovskite matrix material in a volume ratio of 0.1% to 50%.

20. The composite material according to claim 11 wherein said pre-formed semiconductor particles have a size in a range from 1 nm to 30 nm.

21. The composite material according to claim 11 wherein said pre-formed semiconductor particles are monodisperse.

22. The composite material according to claim 11 wherein said pre-formed crystalline or polycrystalline semiconductor particles and said crystalline or polycrystalline perovskite matrix material are selected so that any lattice mismatch between the two lattices does not exceed 5%.

23. A method for synthesizing a composite material, comprising:
mixing pre-formed crystalline or polycrystalline semiconductor particles with a liquid containing one or more precursors of a crystalline or polycrystalline perovskite matrix material to form a mixture, wherein the pre-formed crystalline or polycrystalline particles include lattice planes and the crystalline or polycrystalline perovskite matrix material include lattice planes, said pre-formed crystalline or polycrystalline semiconductor particles and said crystalline or polycrystalline perovskite matrix material being selected so that any lattice mismatch between two lattice planes does not exceed 10%;
subjecting the mixture to conditions suitable to induce formation of the crystalline or polycrystalline perovskite matrix material in which said pre-formed crystalline or polycrystalline semiconductor particles are enveloped to form said composite material; and
wherein said composite material is characterized in that said pre-formed crystalline or polycrystalline semiconductor particle lattice planes and said crystalline or polycrystalline perovskite matrix material lattice planes are substantially aligned such that the pre-formed crystalline or polycrystalline particles and said crystalline or polycrystalline perovskite matrix material are substantially atomically aligned.

24. The method according to claim 23 wherein said perovskite is a perovskite material of form $A_2MX_4$, $AMX_3$, $ANX_4$, or $BMX_4$, wherein
A is a monovalent cation or combination of monovalent cations selected from Li, Na, K, Rb, Cs, Fr, and primary, secondary, tertiary or quaternary organic ammonium compounds containing 1 to 15 carbons,
B is a divalent cation or combination of divalent cations selected from Mg, Co, Ca, Cd, Sr, Ba and primary, secondary, tertiary or quaternary organic ammonium compounds having 1 to 15 carbons,
M is a divalent metal cation or combination of divalent metal cations selected from Pb, Sn, Cu, Ni, Co, Fe, Cr, Pd, Cd, Eu, Yb, Ge,
N is selected from Bi and Sb, and
X is a monovalent anion or combination of monovalent anions selected from I, Br, Cl, SCN, CN, OCN or $BF_4$.

25. The method according to claim 23 wherein said perovskite is any one of $(A)PbI_3$, $(A)PbBr_3$, $(A)PbCl_3$, $(A)PbI_xBr_{(3-x)}$, $(A)PbI_xCl_{(3-x)}$, $(X)PbBr_xCl_{(3-x)}$, $NaPbI_3CsPbI_3$, $CsPbBr_3$, $CsPbCl_3$, $CsPbI_xBr_{(3-x)}$, $CsPbI_xCl_{(3-x)}$, $CsPbBr_xCl_{(3-x)}$, $(C_4H_9NH_3)_2PbI_4$, $(C_4H_9NH_3)_2PbBr_4$, $(C_4H_9NH_3)_2PbCl_4$, $(C_4H_9NH_3)_2PbI_xBr_{(4-x)}$, $(C_4H_9NH_3)_2PbI_xCl_{(4-x)}$, $(C_4H_9NH_3)_2PbBr_xCl_{(4-x)}$, $KPbI_3$, where A is any one of methylammonium ($CH_3NH_3$), ammonium ($NH_4$), formamidium ($CH_2(NH_2)_2$), and ethylammonium ($CH_3CH_2NH_3$).

26. The method according to claim 23 wherein said pre-formed crystalline or polycrystalline semiconductor particles are present in the crystalline or polycrystalline matrix material in a volume of ratio from 0.001% to 80%.

27. The method according to claim 23 wherein said pre-formed crystalline or polycrystalline semiconductor particles are present in the crystalline or polycrystalline matrix material in a volume of ratio from 0.1% to 0 50%.

28. The method according to claim 23 wherein said pre-formed crystalline or polycrystalline semiconductor particles have size in a range from 1 nm to 100 μm.

29. The method according to claim 23 wherein said pre-formed crystalline or polycrystalline semiconductor particles have a size in a range from 1 nm to 30 nm.

30. The method according to claim 23 wherein said pre-formed crystalline or polycrystalline semiconductor particles have a size in a range from 2 nm to 12 nm.

31. The method according to claim 23 wherein said pre-formed crystalline or polycrystalline semiconductor particles are monodisperse.

32. The method according to claim 23 wherein said one or more precursors are all required precursors, and wherein said step of subjecting the mixture to conditions suitable to induce formation of the crystalline or polycrystalline perovskite matrix material includes either exposing the mixture to a solvent that induces precipitation of the perovskite precursors or allowing the liquid in which the precursors are present to evaporate.

33. The method according to claim 23 wherein said one or more precursors all but one required precursor, and wherein said step of subjecting the mixture to conditions suitable to induce formation of the crystalline or polycrystalline matrix material includes producing a solid from said mixture, and including exposing the solid to a final precursor that completes crystallization.

34. The method according to claim 23 wherein the pre-formed crystalline or polycrystalline semiconductor particles, prior to being mixed with the one or more perovskite precursors, is processed to prepare the outer surface thereof to be compatible with the precursors to facilitate formation of the composite with lattice planes that are substantially aligned such that the pre-formed crystalline or polycrystalline semiconductor particles and said perovskite precursors material are substantially atomically aligned.

* * * * *